(12) United States Patent
Kariyazaki et al.

(10) Patent No.: US 10,763,214 B2
(45) Date of Patent: Sep. 1, 2020

(54) SEMICONDUCTOR DEVICE

(71) Applicant: RENESAS ELECTRONICS CORPORATION, Tokyo (JP)

(72) Inventors: Shuuichi Kariyazaki, Tokyo (JP); Kazuyuki Nakagawa, Tokyo (JP); Keita Tsuchiya, Tokyo (JP); Yosuke Katsura, Tokyo (JP); Shinji Katayama, Tokyo (JP); Norio Chujo, Tokyo (JP); Masayoshi Yagyu, Tokyo (JP); Yutaka Uematsu, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/405,644

(22) Filed: May 7, 2019

(65) Prior Publication Data
US 2019/0363050 A1   Nov. 28, 2019

(30) Foreign Application Priority Data
May 25, 2018 (JP) .................................. 2018-100638

(51) Int. Cl.
| H01L 23/538 | (2006.01) |
| H01L 23/66 | (2006.01) |
| H01L 23/498 | (2006.01) |
| H05K 1/02 | (2006.01) |
| H04L 25/02 | (2006.01) |

(52) U.S. Cl.
CPC .... *H01L 23/5383* (2013.01); *H01L 23/49822* (2013.01); *H01L 23/49838* (2013.01); *H01L 23/5386* (2013.01); *H01L 23/66* (2013.01); *H04L 25/0298* (2013.01); *H05K 1/0246* (2013.01); *H01L 2223/6611* (2013.01)

(58) Field of Classification Search
CPC ........... H01L 23/5383; H01L 23/49822; H01L 23/49838; H01L 23/5386; H01L 23/66; H01L 2223/6611; H04L 25/0298; H05K 1/0246
USPC ....................................................... 257/784
See application file for complete search history.

(56) References Cited

U.S. PATENT DOCUMENTS

| 7,501,910 B2 | 3/2009 | Yamagishi et al. |
| 8,081,487 B2 * | 12/2011 | Yamagishi .......... H04L 25/0298 |
| | | 361/778 |

FOREIGN PATENT DOCUMENTS

| JP | 2006-254303 A | 9/2006 |
| JP | 2006-270935 A | 10/2006 |

* cited by examiner

*Primary Examiner* — Tong-Ho Kim
(74) *Attorney, Agent, or Firm* — McDermott Will & Emery LLP

(57) ABSTRACT

Performance of a semiconductor device is improved. The semiconductor device includes a semiconductor chip and a chip component that are electrically connected to each other via a wiring substrate. The semiconductor chip includes an input/output circuit and an electrode pad electrically connected to the input/output circuit and transmitting the signal. The chip component includes a plurality of types of passive elements and includes an equalizer circuit for correcting signal waveforms of the signal, and electrodes electrically connected to the equalizer circuit. The path length from the signal electrode of the semiconductor chip to the electrode of the chip component is 1/16 or more and 3.5/16 or less with respect to the wavelength of the signal.

19 Claims, 21 Drawing Sheets

SEMICONDUCTOR DEVICE

CROSS-REFERENCE TO RELATED APPLICATIONS

The disclosure of Japanese Patent Application No. 2018-100638 filed on May 25, 2018 including the specification, drawings and abstract is incorporated herein by reference in its entirety.

BACKGROUND OF THE INVENTION

The present invention relates to a semiconductor device, and, for example, to technologies effective for application to a semiconductor device including a semiconductor chip for transmitting a signal at high speed.

In Japanese Unexamined Patent Application No. 2006-254303, there is disclosed a semiconductor device in which an inductor component and a resistor component are mounted on a wiring substrate on which a semiconductor chip is mounted.

In Japanese Unexamined Patent Application No. 2006-270935, there is disclosed a semiconductor device in which a high impedance element is formed using a wiring pattern of a wiring substrate.

SUMMARY OF THE INVENTION

The inventor of the present application has developed technologies for improving the performance of a semiconductor device.

As a part of this, efforts have been made to develop technologies for transmitting a signal input to a semiconductor chip mounted on a wiring substrate or a signal output from the semiconductor chip at high speed.

For example, technologies of mounting a circuit for correcting a signal transmission path or a signal waveform at high density has been examined, and it has been found that there is room for improvement.

Therefore, it is necessary to connect a circuit for correcting the signal waveform to the signal transmission path. However, when a circuit for correcting a signal waveform is connected to the signal transmission path, it is necessary to secure a space for arranging the correction circuit, which causes a decrease in mounting density of a plurality of signal transmission paths.

Other objects and novel features will become apparent from the description of this specification and the accompanying drawings.

The semiconductor device according to one embodiment includes a first semiconductor chip and a first chip component electrically connected via a wiring substrate.

The first semiconductor chip includes a first circuit and a first electrode pad electrically connected to the first circuit for transmitting a first signal.

The first chip component includes a plurality of types of passive elements and includes a second circuit for correcting a signal waveform of the first signal, and a second electrode pad electrically connected to the second circuit.

The path distance from the first electrode pad of the first semiconductor chip to the second electrode pad of the first chip component is 1/16 or more and 3.5/16 or less with respect to the wavelength of the first signal.

According to the above embodiment, the performance of the semiconductor device can be improved.

DESCRIPTIONS OF THE PREFERRED EMBODIMENTS

Figure 1:
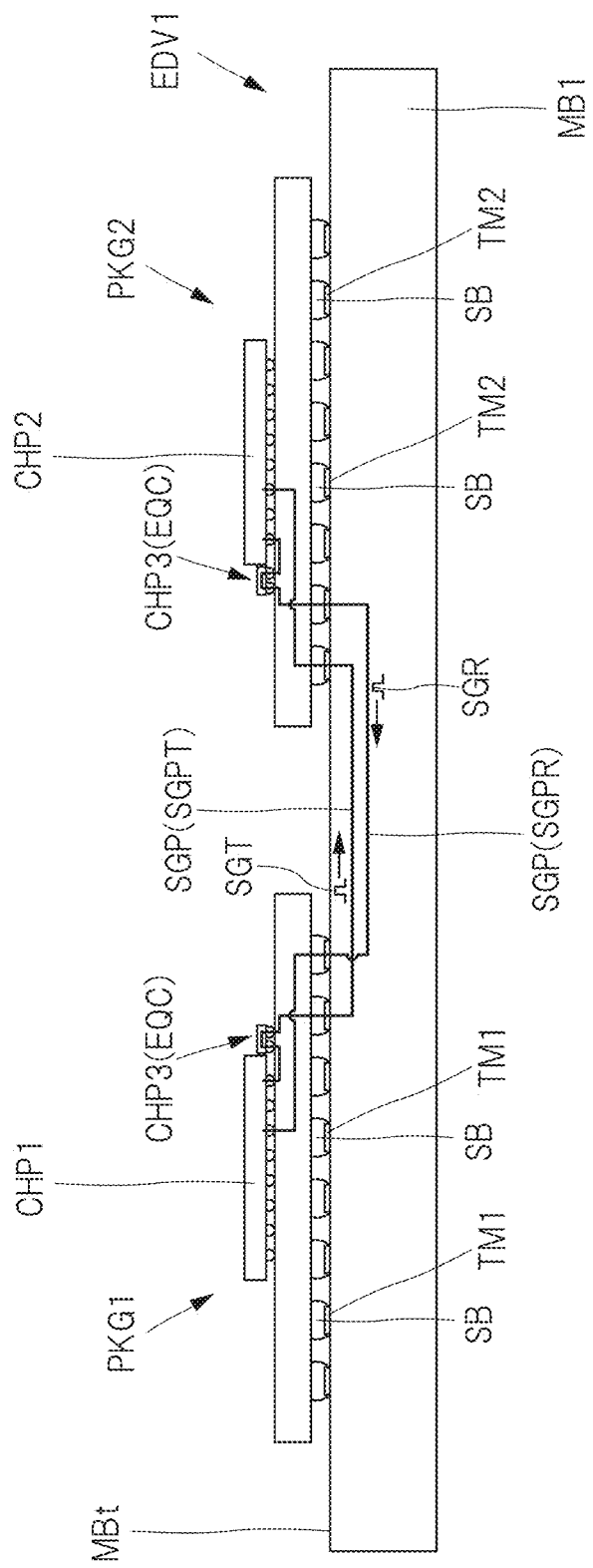
FIG. 1 is an explanatory diagram showing a configuration example of an electronic device.

In the present application, descriptions of embodiments will be divided into a plurality of sections or the like for convenience of description, if necessary, except where expressly stated otherwise, these are not independent from each other, and each part of a single example, one of which is a partial detail or a part or all of the other, whether before or after the description.

In principle, descriptions of similar arts are omitted. Also, each component in an embodiment is not essential, unless expressly stated otherwise, theoretically limited to that number, and obviously otherwise from the context.

Similarly, in the description of the embodiment and the like, "X consisting of A" or the like with respect to the material, composition, and the like does not exclude elements other than A, except when it is clearly indicated that this is not the case and when it is obvious from the context that this is not the case.

For example, regarding a component, it means "X including A as a main component" or the like.

For example, a "silicon member" or the like is not limited to pure silicon, and it is needless to say that a member including a SiGe (silicon-germanium) alloy, a multi-element alloy containing silicon as its main component, other additives, or the like is also included.

In addition, the gold plating, Cu layer, nickel plating, and the like include not only pure materials, but also members containing gold, Cu, nickel, and the like as main components, respectively, unless otherwise specified.

In addition, reference to a specific numerical value or quantity may be greater than or less than that specific numerical value, unless expressly stated otherwise, theoretically limited to that number, and obviously not so from the context.

In the following description, a certain value and another value may be referred to as "the same" or "the same", but the meaning of "the same" or "the same" includes strictly the same cases as well as cases in which there is an error within a range that can be considered to be substantially equivalent.

In the drawings of the embodiments, the same or similar parts are denoted by the same or similar symbols or reference numerals, and the description will not be repeated in principle.

In addition, in the attached drawings, hatching and the like may be omitted even in a cross-section when it becomes complicated or when it is clearly distinguished from a gap.

In this connection, even if the hole is closed in plan, the outline of the background may be omitted when it is obvious from the description or the like.

In addition, hatching or dot patterns may be added to indicate that it is not a void, even if it is not a cross-section, or to indicate the boundary of a region.

First, a configuration example of an electronic device in which a plurality of semiconductor devices (semiconductor packages) is mounted on a motherboard and electric signals are transmitted between the plurality of semiconductor devices will be described with reference to FIGS. 1 and 2.

FIG. 1 is an explanatory diagram showing a configuration example of an electronic device including the semiconductor device of the present embodiment.

Figure 2:
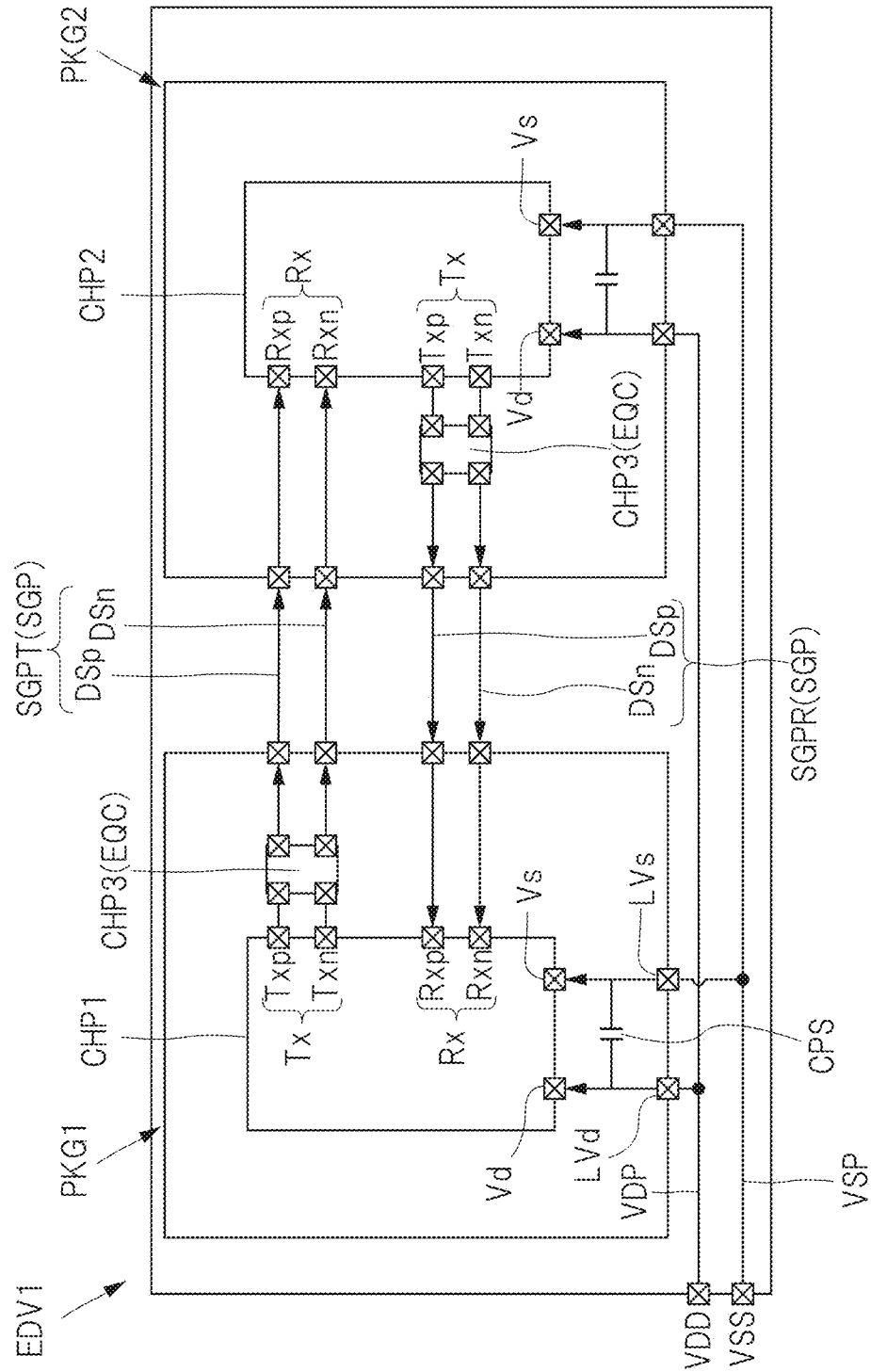
FIG. 2 is an explanatory diagram showing a configuration example of a circuit included in the electronic device shown in FIG. 1.

FIG. 2 is an explanatory diagram showing a configuration example of a circuit included in the electronic device shown in FIG. 1.

In FIG. 1, in order to explicitly indicate that the semiconductor device PKG1 and the semiconductor device PKG2 are electrically connected to each other, the signal transmission path SGP shown in FIG. 2 is schematically illustrated by a thick line.

The electronic device (electronic device) EDV1 shown in FIG. 1 includes a wiring hoard (motherboard, mounting board) MB 1, and a semiconductor device PKG1 and a semiconductor device PKG2 mounted on the wiring board MB1.

The semiconductor device PKG1 and the semiconductor device PKG2 are electrically connected to each other via a signal transmission path SGP formed in the wiring board MB1.

The signal transmitted through the signal transmission path SGP includes a signal SGT outputted from the semiconductor device PKG1 and a signal SGR inputted to the semiconductor device PKG1.

The signal transmission path SGP includes a signal transmission path SGPT through which the signal SGT is transmitted and a signal transmission path SGPR through which the signal SGR is transmitted.

In the embodiment shown in FIG. 1, the signal SGT is outputted from the semiconductor device PKG1, and the signal SGT is inputted to the semiconductor device PKG2.

The signal SGR is outputted from the semiconductor device PKG2, and the signal SGR is inputted to the semiconductor device PKG1.

However, the output destination of the signal SGT and the output source of the signal SGP are not limited to the example shown in FIG. 1, and there are various modified examples.

Since the semiconductor device PKG1 and the semiconductor device PKG2 shown in FIG. 1 have the same structures, the semiconductor device PKG1 will be representatively described below.

As shown in FIG. 2, the electronic device EDV1 has a plurality of signaling paths SGPs.

In the example shown in FIG. 2, the plurality of signal transmission paths SGPs connected to the semiconductor device PKG1 are high-speed transmission paths through which a signal is transmitted at a data rate of, for example, 10 Gbps (Gigabit per second) to 60 Gbps.

Although not shown in FIGS. 1 and 2, the signal transmission path SGP may include a low-speed transmission path through which a signal is transmitted at a data rate of, for example, 3 Gbps or less, in addition to a high-speed transmission path through which a signal is transmitted at a data rate of 10 Gbps or more.

In the example shown in FIG. 2, the signal transmission path SGP is composed of a pair of differential signal transmission paths DSp and DSn through which differential signals are transmitted.

In the present embodiment, as an example of the signal transmission path SGP, an embodiment in which a differential signal is transmitted via a pair of differential signal transmission paths DSp and DSn is described, but various modifications other than the differential signal can be applied to the type of the high-speed signal.

For example, even in the case of a so-called single-ended structure in which one signal transmission path SGP is used, high-speed transmission can be performed by increasing the frequency.

When the signal transmission path SGP includes a low-speed transmission path, the low-speed transmission path has a single-ended structure.

As shown in FIG. 2, the semiconductor chip CHP1 of the semiconductor device PKG1 includes a plurality of electrodes (electrode pads).

The plurality of electrodes of the semiconductor chip CHP1 include signal electrodes (electrode pads) Tx (specifically, signal electrodes Txp and Txn for outputting a pair of differential signals) to which a signal SGT (see FIG. 1) as an output signal (transmission signal) is transmitted.

The plurality of electrodes of the semiconductor chip CHP1 include signal electrodes (electrode pads) Rx (specifically, a signal electrode Rxp and a signal electrode Rxn to which a pair of differential signals are input) to which a signal SGR (see FIG. 1) as an input signal (reception signal) is transmitted.

The plurality of electrodes of the semiconductor chip CHP1 include a power supply potential electrode Vd to which the power supply potential VDD is supplied and a reference potential electrode Vs to which the reference potential VSS is supplied.

The power supply potential VDD is supplied to the semiconductor chip CHP1, i.e., circuits included in the semiconductor chip CHP1, via the power supply potential electrodes Vd.

The reference potential VSS is supplied to the semiconductor chip CHP1 via the reference potential electrodes Vs.

At least a part of the plurality of circuits included in the semiconductor chip CHP1 is driven by a driving voltage generated by a potential difference between the power supply potential VDD and the reference potential VSS.

The reference potential VSS is, for example, a ground potential, and the power supply potential VDD is higher than the reference potential VSS.

In the signal transmission path SGP formed by electrically connecting the signal electrode Tx and the signal electrode Rx shown in FIG. 2, as described above, an electric signal is transmitted at a transmission rate of about 10 Gbps to 60 Gbps.

In the signal transmission path SGP, a demand level for reduction of transmission loss, reduction of crosstalk noise, and the like is high.

In particular, in order to cope with a transmission rate exceeding 50 Gbps, for example, due to a method of encoding an electric signal or the like, demands for reduction of transmission loss, quality of a signal waveform, or the like become very high.

For example, as a transmission code system used when electric signals are transmitted, there is a system called NRZ (non return to zero).

In the NRZ system, two states of the signal pulse, e.g., a positive voltage level and a zero volt voltage level, represent one bit.

In the case of the NRZ system, the frequency of the pulse signal is increased to increase the speed of signal transmission.

As the frequency of the pulse signal increases, the level of demand for reduction of transmission loss, reduction of crosstalk noise, and the like increases.

As a method of increasing the data rate (data transfer rate) of signals, there is a modulation method called pulse-amplitude modulation (pulse amplitude modulation).

In PAM, the amplitudes of signal waveforms are classified into a plurality of types for each symbol.

For example, in the PAM4, the signal waveforms are classified into four types of amplitude levels (hereinafter, referred to as four amplitude levels).

In the PAM4 case, since 4 bits can be represented in one cycle, the data rate can be increased even if the signal transmission rate is assumed to be the same.

When the ½ frequency is the Nyquist frequency, for example, when the signal is transmitted at a data rate of 56 Gbps using the NRZ method, it is 28 GHz. However, when the signal is transmitted at a data rate of 56 Gbps using the PAM4, it is 14 GHz.

Therefore, if the data rates are the same, the transmission loss can be reduced by using the PAM4.

However, in the case of the PAM4, the opening (eye opening) of the eye pattern corresponding to the four values needs to be clarified.

In addition, since the amplitude of the eye opening corresponding to the four values is smaller than that of the eye opening corresponding to the two values, the improvement of the waveform quality becomes more important.

Therefore, the required level for reduction of crosstalk noise, jitter, and the like becomes more stringent than in the case of the NRZ system.

For example, in the case of performing signal transmission at a data rate of 56 Gbps using PAM4, the crosstalk with respect to the signal transmission path SGP needs to be ¹/₁₀ or less as compared with the case of performing signal transmission at a data rate of 12.5 Gbps using the NRZ system.

As described above, in the case of the PAM4, transmission loss can be reduced as compared with the NRZ system, but transmission loss needs to be reduced as compared with the case of performing signal transmission at a data rate of 12.5 Gbps, for example.

In order to reduce crosstalk, there is a method of arranging conductor patterns to which a ground potential is supplied between signal transmission paths SGP adjacent to each other.

However, when the signal transmission is performed at 56 Gbps using the PAM4, the area of the conductive patterns such as the electrodes constituting the signal transmission path SGP needs to be increased by about 1.5 times as compared with the case where the signal transmission is performed at 12.5 Gbps using the NRZ system.

As a method of improving the waveform quality of a signal, there is a method of connecting a circuit for correcting a signal to the signal transmission path SGP.

In the present embodiment, as shown in FIG. 2, in the semiconductor device PKG1, the chip component CHP3 having the equalizer circuits EQC is connected to the signal transmission path SGPT.

The equalizer circuit EQC is a circuit for making the rise of the signal waveform steep by using the reflected wave of the signal.

As a circuit for correcting a signal, there is a circuit for increasing the amplitude of an eye opening by increasing the gain of a specific frequency.

However, when a circuit for adjusting the gain is included in the equalizer circuit EQC, it is necessary to supply an active element such as a transistor and a power supply for driving the active element to the equalizer circuit EQC.

Therefore, the structure of the equalizer circuit EQC becomes complicated, and the occupied area of the equalizer circuit EQC increases.

The inventor of the present application has found a method of increasing the gain of a specific frequency by utilizing the reflection of a signal without including the function of adjusting the gain in the equalizer circuit EQC.

This can suppress an increase in the area of the equalizer circuit EQC.

In addition, this can reduce the power required for the circuit for adjusting the gain.

Details of the equalizer circuit EQC and the method of increasing the gain will be described later.

As an example of the semiconductor device PKG1 shown in FIG. 1, a structural example of a signal transmission path in the semiconductor device PKG1 will be described.

Figure 3:
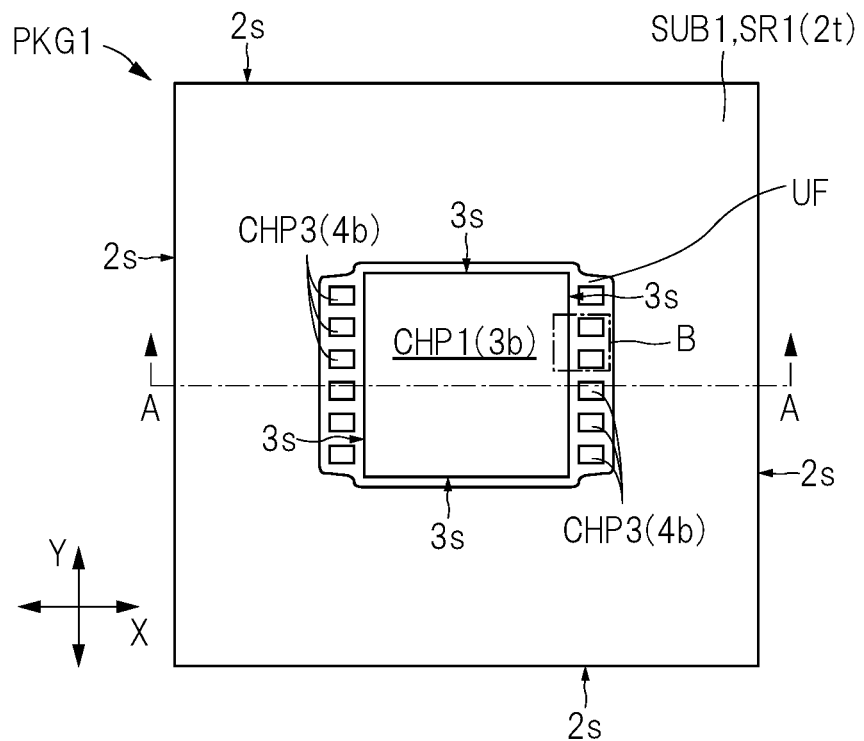
FIG. 3 is a top view of one of the two semiconductor devices shown in FIG. 1.

FIG. 3 is a top view of one of the two semiconductor devices shown in FIG. 1.

Figure 4:
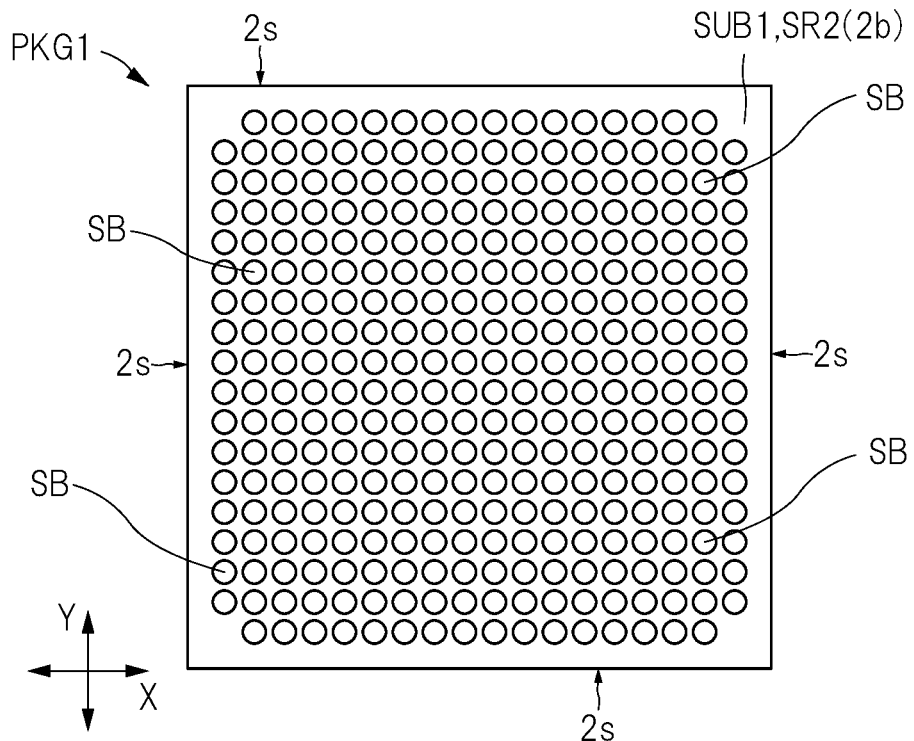
FIG. 4 is a bottom view of the semiconductor device shown in FIG. 3.

FIG. 4 is a bottom view of the semiconductor device shown in FIG. 3.

Figure 5:
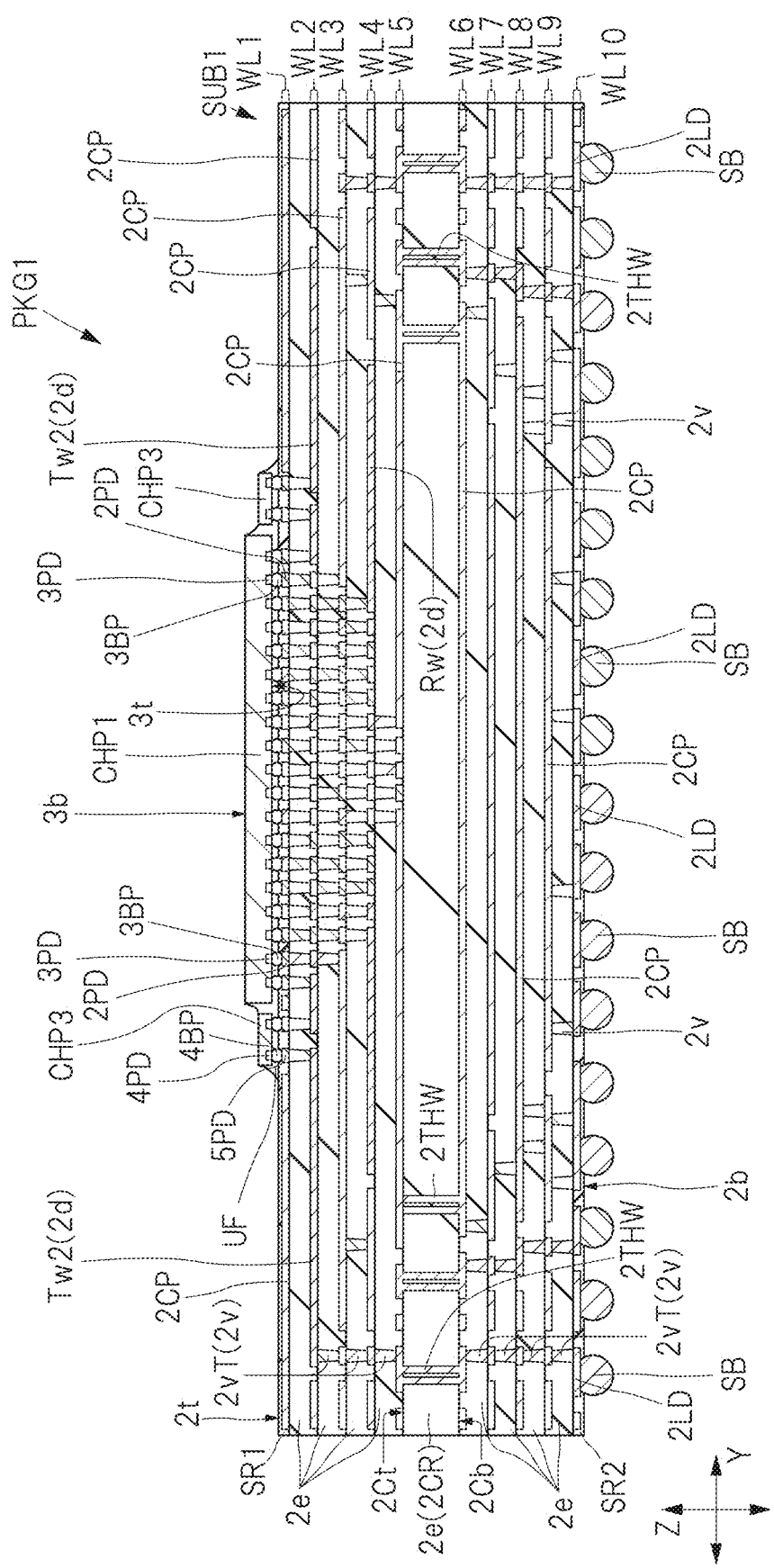
FIG. 5 is a cross-sectional view taken along line A-A of FIG. 3.

FIG. 5 is a cross-sectional view taken along line A-A of FIG. 3.

Figure 6:
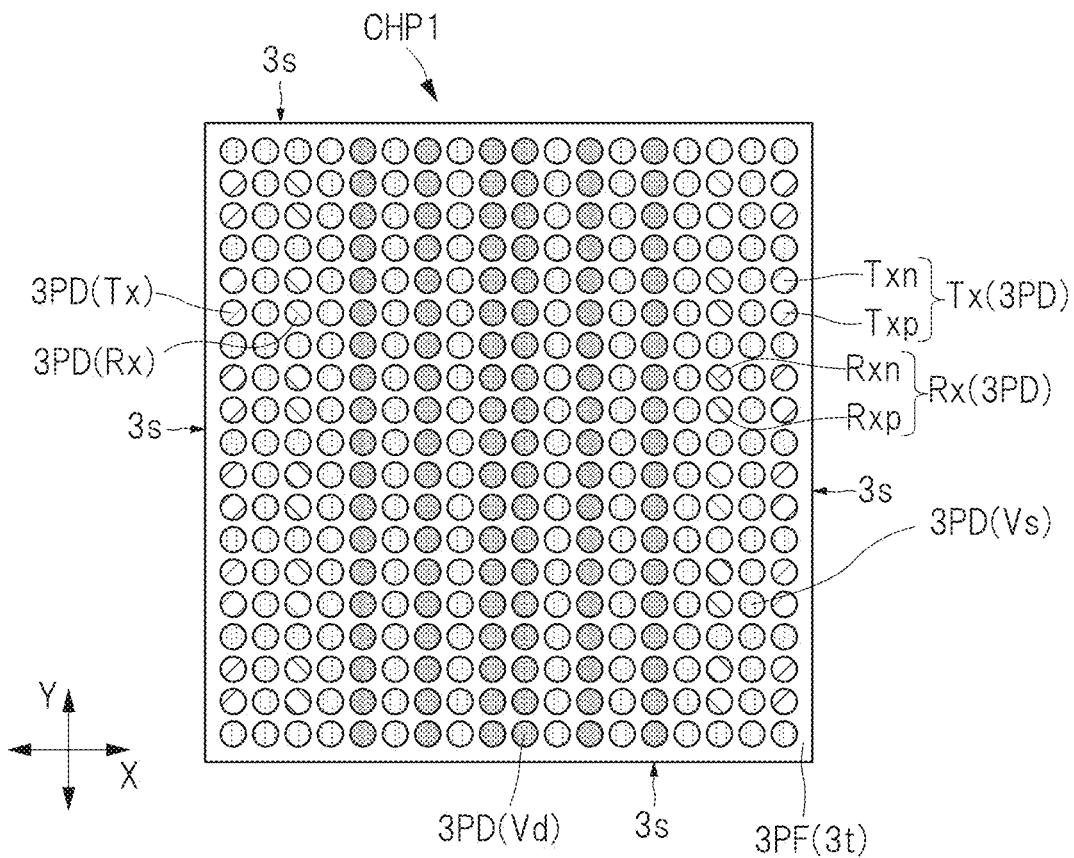
FIG. 6 is plan view of an electrode arrangement surface of the semiconductor chip shown in FIG. 5.

FIG. 6 is plan view of an electrode arrangement surface of the semiconductor chip shown in FIG. 5.

Figure 7:
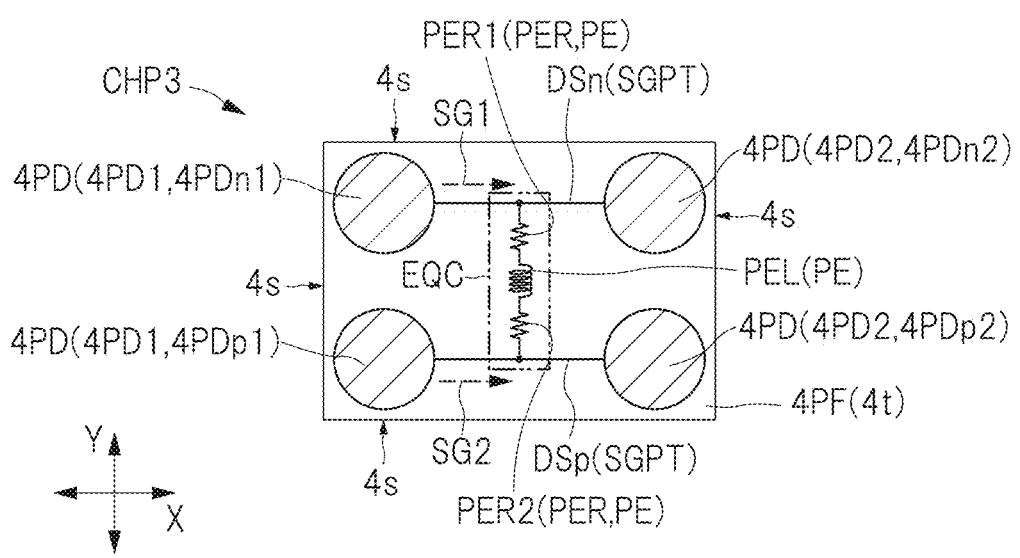
FIG. 7 is plan view of an electrode arrangement surface of the chip component shown in FIG. 5.

FIG. 7 is plan view of an electrode arrangement surface of the chip component shown in FIG. 5.

FIG. 7 shows examples of equalizer circuits EQCs included in the chip component CHP3.

In FIG. 6 and FIG. 7, in order to distinguish the types of signals and potentials supplied to the respective transmission paths, the plurality of electrodes is hatched and patterned.

The transmission path of the output signal (transmission signal) and the transmission path of the input signal (reception signal) are hatched differently from each other.

In FIG. 6, a dot pattern is applied to the transmission path of the reference potential VSS (see FIG. 2).

In FIG. 6, the transmission path of the power supply potential VDD (see FIG. 2) is provided with a dot pattern that is thicker than the transmission path of the reference potential VSS.

In the present embodiment, an embodiment in which the number of terminals and the number of capacitors are small is exemplarily described.

However, the number of terminals and the number of capacitors are not limited to the number of examples shown in this embodiment, and various modifications can be applied.

The semiconductor device PKG1 of the present embodiment includes a wiring substrate SUB1, a semiconductor chip CHP1 mounted on the wiring substrate SUB1 (see FIG. 3), and a chip component CHP3 mounted on the wring substrate SUB1.

As shown in FIG. 5, the wiring substrate SUB1 has an upper surface (a surface, a main surface, a chip mounting surface, a first main surface) $2t$ on which the semiconductor chip CHP1 and the chip component CHP3 are mounted, and a lower surface (a surface, a main surface, a mounting surface, a second main surface) $2b$ which is opposed to the upper surface $2t$.

In the wiring substrate SUB1, each of the upper surface $2t$ and the lower surface $2b$ has a plurality of sides $2s$ (see FIGS. 3 and 4) in plan view.

In the present embodiment, the upper surface $2t$ (see FIG. 3) and the lower surface $2b$ (see FIG. 4) of the wiring substrate SUB1 are each square.

The wiring substrate SUB1 is an interposer (relay board) that electrically connects the semiconductor chip CHP1 mounted on the upper surface $2t$ and the wiring board MB1 (see FIG. 1) that is a motherboard (mounting board) to each other.

The wiring substrate SUB1 has a plurality of wiring layers WL1, WL2, WL3, WL4, WL5, WL6, WL7, WL8, WL9, and WL10 (10 layers in the embodiment shown in FIG. 5) for electrically connecting the terminal on the upper surface $2t$ side, which is the chip-mounting surface, and the terminal on the lower surface $2b$ side, which is the chip-mounting surface.

Each wiring layer has a conductor pattern such as a wiring which is a path for supplying an electric signal or electric power.

An insulating layer $2e$ is disposed between the wiring layers.

Each wiring layer is electrically connected via a via $2v$, which is an interlayer conductive path penetrating the insulating layer $2e$, or through-hole wiring 2THW.

In addition, most of the wiring layer WL1 disposed on the uppermost surface $2t$ side of the plurality of wiring layers is covered with the insulating layer SR1 which is a solder resist film.

In addition, most of the wiring layer WL10 disposed on the lowermost surface $2b$ of the plurality of wiring layers is covered with the insulating layer SR2 which is a solder resist film.

The wiring substrate SUB1 is formed, for example, by laminating a plurality of wiring layers on the upper surface $2Ct$ and the lower surface $2Cb$ of an insulating layer (core material, core insulating layer) 2CR made of a prepreg in which a glass fiber is impregnated with a resin by a build-up method.

The wiring layer WL5 on the upper surface $2Ct$ of the insulating layer 2CR and the wiring layer WL6 on the lower surface $2Cb$ are electrically connected via a plurality of through-hole wirings 2THW embedded in a plurality of through-holes provided so as to pass through one of the upper surface $2Ct$ and the lower surface $2Cb$ to the other.

A plurality of terminals (pads, bonding pads, bonding leads, and semiconductor chip connecting terminals) 2PD electrically connected to the semiconductor chip CHP1 are formed on the upper surface $2t$ of the wiring substrate SUB1.

A plurality of terminals (pads, bonding pads, bonding leads, and semiconductor-chip connecting terminals) 5PD electrically connected to the chip components CHP3 are formed on the upper surface $2t$ of the wiring substrate SUB1.

On the lower surface $2b$ of the wiring substrate SUB1, a plurality of lands 2LD, which is external input/output terminals of the semiconductor device PKG1, is formed.

Each of the plurality of terminals 2PD and 5PD is electrically connected to the land 2LD via wiring $2d$, via $2v$, and through-hole wiring 2THW formed on the wiring substrate SUB1.

In the examples shown in FIG. 5, the wiring substrate SUB1 shows a wiring board in which a plurality of wiring layers is stacked on the upper surface $2Ct$ side and the lower surface $2Cb$ side of the insulating layer 2CR, which is a core material.

However, as a modification to FIG. 5, a so-called coreless substrate may be used in which the insulating layer 2CR made of a hard material such as a prepreg material is not provided, and conductor patterns such as the insulating layer $2e$ and the wiring $2d$ are formed by stacking in order.

When the coreless substrate is used, the through-hole wiring 2THW is not formed, and each wiring layer is electrically connected via the via $2v$.

Although FIG. 5 exemplarily shows a wiring substrate SUB1 having 10 wiring layers, a wiring substrate having 11 or more or 9 or less wiring layers, for example, may be used as a modification.

In the example shown in FIG. 5, solder balls (solder material, external terminals, electrodes, and external electrodes) SB are connected to each of the plurality of lands 2LD.

The solder balls SB are conductive members that electrically connect the plurality of terminals (not shown) on the wiring board MB1 and the plurality of lands 2 LD when the semiconductor device PKG1 is mounted on the wiring board MB1 shown in FIG. 1.

The solder ball SB is, for example, an Sn—Pb solder material containing lead (Pb), or a solder material made of a so-called lead-free solder that does not substantially contain Pb.

Examples of lead-free solder include, for example, tin (Sn), tin-bismuth (Sn—Bi), tin-copper-silver (Sn—Cu—Ag), tin-copper (Sn—Cu), and the like.

Here, the lead-free solder means a solder in which the content of lead (Pb) is 0.1 wt % or less, and this content is determined as a standard of the RoHS (Restriction of Hazardous Substances) command.

As shown in FIG. 4, the plurality of solder balls SB is arranged in a matrix.

Although not shown in FIG. 4, a plurality of lands 2LD (see FIG. 5) to which a plurality of solder balls SB is bonded are also arranged in a matrix form.

In this manner, a semiconductor device in which a plurality of external terminals (solder balls SB and lands 2LD) is arranged in a matrix on the mounting surface of the wiring substrate SUB1 is referred to as an area-array type semiconductor device.

The area array-type semiconductor device can effectively utilize the mounting surface (lower surface $2b$) of the wiring substrate SUB1 as a space for arranging external terminals, which is preferable in that an increase in the mounting area of the semiconductor device can be suppressed even if the number of external terminals increases.

In other words, a semiconductor device in which the number of external terminals increases with higher functionality and higher integration can be mounted in a space-saving manner.

The semiconductor device PKG1 has a semiconductor chip CHP1 mounted on the wiring substrate SUB1.

As shown in FIG. 5, each of the semiconductor chips CHP1 includes a front surface (main surface, upper surface) $3t$ and a back surface (main surface, lower surface) $3b$ that is opposed to the front surface $3t$.

As shown in FIG. 6, the front surface $3t$ of the semiconductor chip CHP1 has a plurality of sides $3s$ in plan view.

As shown in FIG. 3, the semiconductor chip CHP1 has a rectangular outer shape having a plane area smaller than that of the wiring substrate SUB1 in plan view.

In the embodiment shown in FIG. 3, the semiconductor chip CHP1 is mounted on the central portion of the upper surface $2t$ of the wiring substrate SUB1, and each of the four sides $3s$ of the semiconductor chip CHP1 extends along each of the four sides $2s$ of the wiring substrate SUB1.

As shown in FIG. 6, a plurality of electrodes (pads, electrode pads, bonding pads) 3PD is formed on the front surface $3t$ of the semiconductor chip CHP1.

The plurality electrodes 3PD is exposed from an insulating film (passivating film, protective insulating film) 3PF covering most of the surface $3t$ of the semiconductor chip CHP1 on the surface $3t$ of the semiconductor chip CHP1.

The plurality of electrodes 3PD is arranged in a plurality of rows from the outermost periphery closest to the outer edge of the surface $3t$ at the surface $3t$ toward the center of the surface $3t$.

In the present embodiment, a plurality of electrodes 3PD is arranged in matrix or arrays on the front surface $3t$ of the semiconductor chip CHP1.

By arranging the plurality of electrodes 3PD of the semiconductor chip CHP1 in a matrix form, it is possible to effectively utilize the front surface $3t$ of the semiconductor chip CHP1 as an arrangement space for the electrodes, which is preferable in that even if the number of electrodes of the semiconductor chip CHP1 increases, an increase in the planar area can be suppressed.

However, although not shown, as a modification to the present embodiment, the present invention can be applied to a type of semiconductor chip in which a plurality of electrodes 3PD is arranged at the peripheral portion of the surface $3t$ and are not arranged at the center portion.

In addition, in the embodiment shown in FIG. 5, the semiconductor chip CHP1 is mounted on the wiring substrate SUB1 with the front surface $3t$ facing the upper surface $2t$ of the wiring substrate SUB1.

Such a mounting method is called a face-down mounting method or a flip-chip connection method.

Although not shown, a plurality of semiconductor elements (circuit elements) is formed on the main surface of the semiconductor chip CHP1 (more specifically, a semiconductor element forming area provided on an element forming surface of a semiconductor substrate which is a base material of the semiconductor chip CHP1).

The plurality of electrodes 3PD is electrically connected to the plurality of semiconductor elements via wrings (not shown) formed in wiring layers disposed inside the semiconductor chips CHP1 (in detail, between the front surfaces $3t$ and semiconductor element forming regions (not shown)).

The semiconductor chip CHP1 (more specifically, the base material of the semiconductor chip CHP1) is made of, for example, silicon (Si).

In addition, an insulating film 3PF (see FIG. 6) covering the base material of the semiconductor chip CHP1 and the wirings of the semiconductor chip CHP1 is formed on the front surface $3t$, and a part of each of the plurality of electrodes 3PD is exposed from the insulating film in an opening portion formed in the insulating film 3PF.

Each of the plurality of electrodes 3PD is made of metal, and in the present embodiment, is made of aluminum (Al), for example.

As shown in FIG. 5, the plurality of electrodes 3PD is respectively connected to the protruding electrodes 3BP, and the plurality of electrodes 3PD of the semiconductor chip CHP1 and the plurality of terminals 2PD of the wiring substrate SUB1 are electrically connected to each other via the plurality of protruding electrodes 3BP.

The protruding electrodes (bump electrodes) 3BP are metallic members (conductive members) formed so as to protrude above the surfaces $3t$ of the semiconductor chips CHP1.

In the present embodiment, the protruding electrode 3 BP is a so-called solder bump in which a solder material is laminated on the electrode 3PD via an under-bump metal film.

As the base metal film, for example, a laminated film in which titanium (Ti), copper (Cu), and nickel (Ni) are laminated from the connection surface side with the electrode 3PD (in some cases, a gold (Au) film is further formed on the nickel film) can be exemplified.

As a solder material constituting the solder bump, a solder material containing lead or a lead-free solder can be used, similarly to the above-described solder ball SB.

When the semiconductor chip CHP1 is mounted on the wiring substrate SUB1, solder bumps are formed in advance on both of the plurality of electrodes 3PD and the plurality of terminals 2PD, and the solder bumps are contacted with each other by performing a heat treatment (reflow treatment), whereby the solder bumps are integrated to form the protruding electrodes 3BP.

As a modification to the present embodiment, a pillar bump (columnar electrode) in which a solder film is formed on the tip surface of a conductor pillar made of copper (Cu) or nickel (Ni) may be used as the projection electrode 3BP.

The semiconductor device PKG1 includes a chip component CHP3 mounted on the wiring substrate SUB1.

As shown in FIG. 7, each of the chip components CHP3 includes a front surface (main surface, upper surface) $4t$ and a back surface (main surface, lower surface) $4b$ (see FIG. 3) which is opposed to the front surface $4t$.

The front face 4t of the chip component CHP3 has a plurality of sides 4s in plan view.

As shown in FIG. 3, the chip component CHP3 has a rectangular outer shape having a plane area smaller than that of the semiconductor chip CHP1 in plan view.

A plurality of electrodes (pads, electrode pads, bonding pads) 4PD is formed on the front surface 4t of the chip component CHP3.

In the embodiment shown in FIG. 7, the chip component CHP3 includes four electrodes 4PD.

The plurality of electrodes 4PD is exposed from an insulating film (passivating film, protective insulating film) 4PF covering most of the surface 4t of the chip component CHP3 on the surface 4t of the chip component CHP3.

Figure 14:
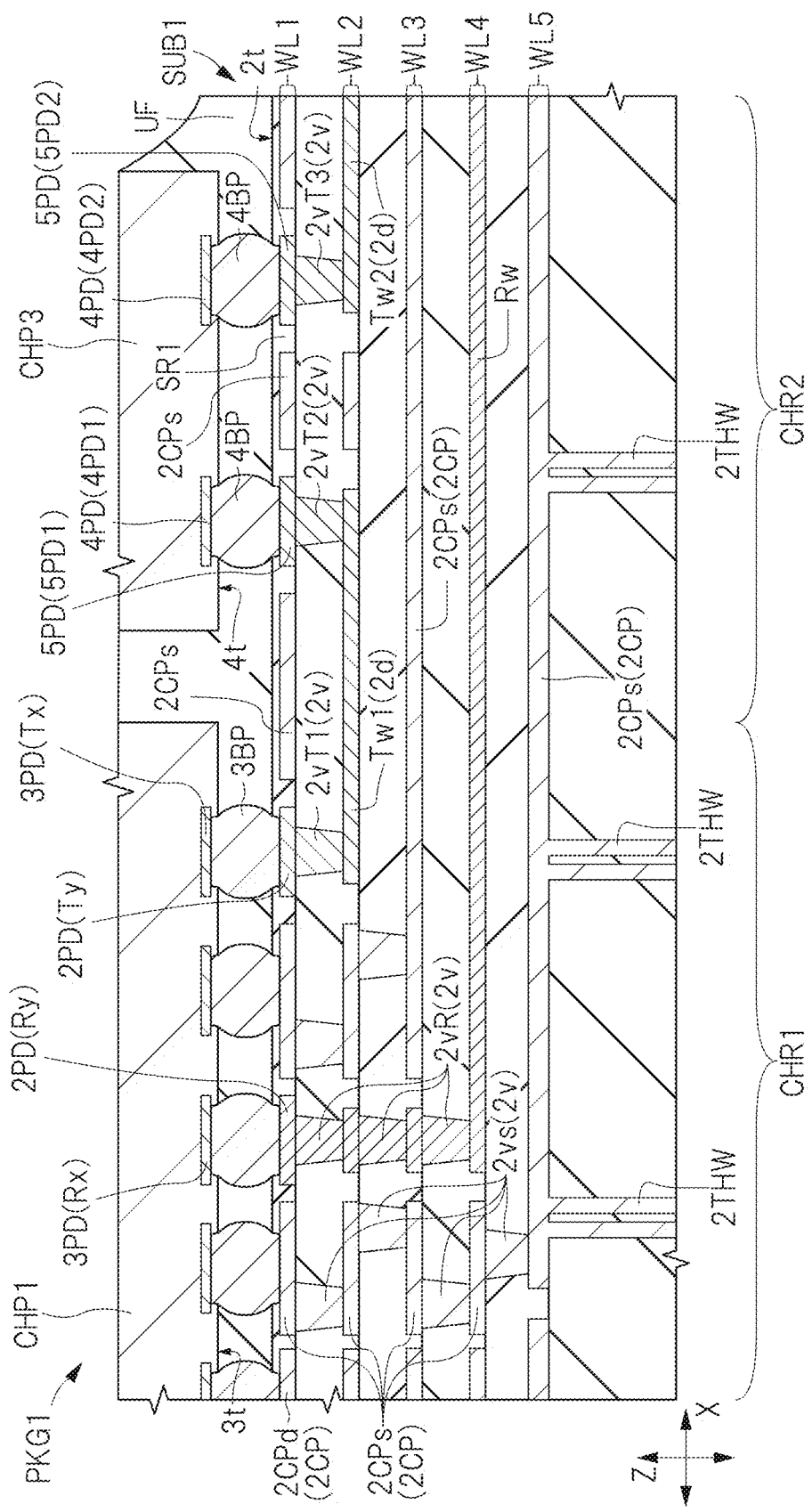
FIG. 14 is an enlarged cross-sectional view taken along line A-A of FIG. 13.

As shown in FIG. 14 to be described later, in the present embodiment, the chip component CHP3 is mounted on the wiring substrate SUB1 with the front surface 4t facing the upper surface 2t of the wiring substrate SUB1.

In other words, the chip component CHP3 is mounted on the printed wiring substrate SUB1 by a face-down mounting method or a flip-chip connecting method.

The chip component CHP3 shown in FIG. 7 is a semiconductor chip having a base material made of, for example, silicon.

However, the chip component CHP3 differs from the semiconductor chip CHP1 shown in FIG. 6 in that it does not have active elements such as transistors and diodes, but only passive elements PE such as resistive elements PER and inductor elements PEL.

The inductor element PEL is formed by providing a conductor pattern in a wiring layer on a semiconductor substrate. In addition, the resistance element PER can be miniaturized by using a semiconductor layer.

Each of the plurality of passive elements PE of the chip component CHP3 is connected to the electrodes 4PD of the chip component CHP3.

In addition, an insulating film 4PF covering the base material of the chip component CHP3 and the wirings is formed on the front surface 4t, and a part of each of the plurality of electrodes 4PD is exposed from the insulating film in the opening portion formed in the insulating film 4PF.

Each of the plurality of electrodes 4PD is made of metal, and in the present embodiment, is made of aluminum (Al), for example.

As shown in FIG. 5, the protrusion electrodes 4BP are connected to the plurality of electrodes 4PD, respectively, and the plurality of electrodes 4PD of the chip component CHP3 and the plurality of terminals 2PD of the wiring substrate SUB1 are electrically connected via the plurality of protrusion electrodes 4BP, respectively.

The protruding electrodes (bump electrodes) 4BP are metallic members (conductive members) formed so as to protrude above the front surfaces 4t of the chip component CHP3.

In the present embodiment, the protruding electrode 4BP is a so-called solder bump in which a solder material is laminated on the electrode 4PD via an under-bump metal film.

As the base metal film, for example, a laminated film in which titanium (Ti), copper (Cu), and nickel (Ni) are laminated from the connection surface side with the electrode 4PD (in some cases, a gold (Au) film is further formed on the nickel film) can be exemplified.

As a solder material constituting the solder bump, a solder material containing lead or a lead-free solder can be used, similarly to the above-described solder ball SB.

When the chip component CHP3 is mounted on the wiring substrate SUB1, solder bumps are formed in advance on both of the plurality of electrodes 4PD and the plurality of terminals 2PD, and heat treatment (reflow treatment) is performed while the solder bumps are contacted with each other, whereby the solder bumps are integrated to form the protruding electrodes 4BP.

As a modification to the present embodiment, a pillar bump (columnar electrode) in which a solder film is formed on the tip surface of a conductor pillar made of copper (Cu) or nickel (Ni) may be used as the projection electrode 4BP.

As shown in FIG. 5, an underfill resin UF is disposed between the semiconductor chip CHP1 and the wiring substrate SUB1, and between the chip component CHP3 and the wiring substrate SUB1.

The underfill resin UF is disposed so as to close the space between the semiconductor chip CHP1 and the wiring substrate SUB1, and the space between the chip component CHP3 and the wiring substrate SUB1.

The underfill resin UF is made of an insulating (non-conductive) material (for example, a resin material).

The electrical connection portions between the semiconductor chip CHP1 and the wiring substrate SUB1 (the bonding portions of the plurality of protruding electrodes 3BP) and the electrical connection portions between the chip component CHP3 and the wiring substrate SUB1 (the bonding portions of the plurality of protruding electrodes 4BP) are sealed with the underfill resin UF.

In this manner, by covering the bonding portions between the plurality of protruding electrodes 3BP and 4BP and the plurality of terminals 2PD and 5PD with the underfill resin UF, it is possible to alleviate the stress generated in the electrically connecting portions between the semiconductor chip CHP1 or the chip component CHP3 and the wiring substrate SUB1.

Next, a signal correction circuit inserted into the signal transmission path SGP shown in FIG. 2 will be described.

Figure 8:
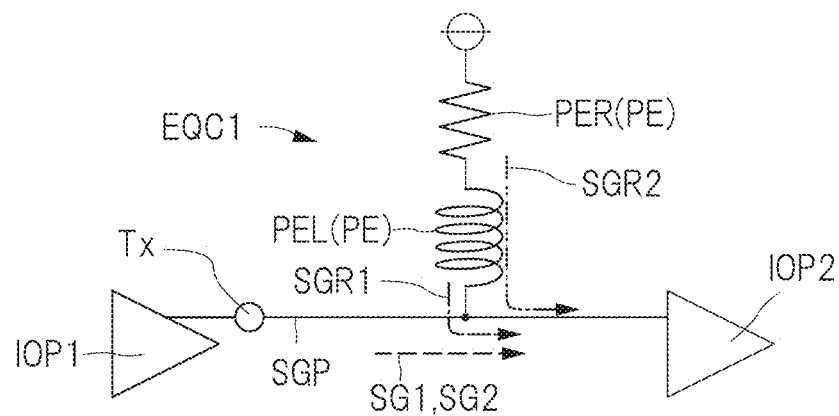
FIG. 8 is a circuit diagram showing an example of a circuit for making the rising edge of the signal waveform steep.

FIG. 8 is a circuit diagram showing an example of a circuit for making the rising edge of the signal waveform steep.

Figure 9:
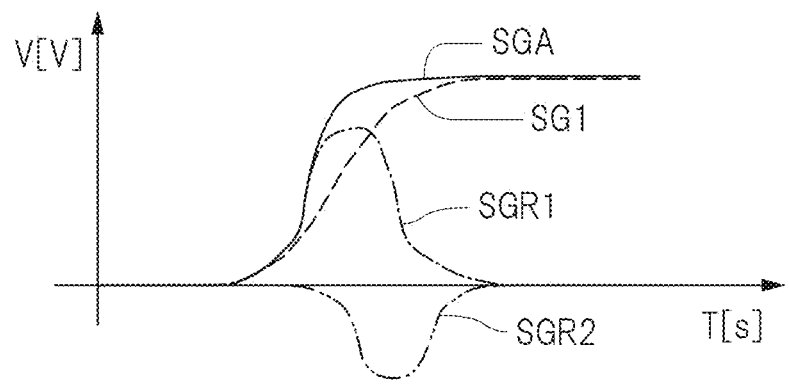
FIG. 9 is an explanatory diagram schematically showing a state in which the rising edge of the signal waveform becomes steep due to the influence of the reflected wave when the signal current flows in the circuit shown in FIG. 8.

FIG. 9 is an explanatory diagram schematically showing a state in which the rising edge of the signal waveform becomes steep due to the influence of the reflected wave when the signal current flows in the circuit shown in FIG. 8.

In FIGS. 8 and 9, the signal SG1 is indicated by a dotted line, the reflected wave SGR1 is indicated by a dashed-dotted line, and the reflected wave SGR2 is indicated by a dashed-dotted line.

In FIG. 9, the vertical axis represents the voltage V, and the horizontal axis represents the time T.

The equalizer circuit EQC1 shown in FIG. 8 is a signal correcting circuit that sharpens the rise of signal waveforms in the input/output circuit IOP2 of the signal SG1 output from the signal electrodes Tx and transmitted via the signal transmission path SGP.

The equalizer EQC1 includes an inductor element PEL connected to the signal transmission path SGP, and a resistor element PER connected to the signal transmission path SGP via the inductor element PEL.

The impedance of the inductor element PEL is higher than the impedance of the resistor element PER.

The equalizer circuit EQC1 is a passive equalizer circuit composed of a plurality of passive elements PEs.

The signal SG1 output from the input/output circuit (IO port, output control circuit in the case of FIG. 8) IOP1 is input to the input/output circuit (IO port, input control circuit in the case of FIG. 8) IOP2 via the signal transmission path SGP.

When the signal SG1 flows through the signal transmission path SGP, a current flows through the equalizer EQC1 branched from the signal transmission path SGP.

Part of the signals flowing to the equalizer circuits EQC1 is reflected by the high-impedance inductor elements PEL, and a reflected wave SGR1 is generated in the high-impedance inductor elements PEL.

Since the impedance of the inductor element PEL is larger than the input waveform of the signal SG1, the transition direction of the reflected wave SGR1 is the same as the transition direction of the waveform of the signal SG1, as shown in FIG. 9.

In addition, in the waveform of signal SG1, the amplitude of the reflected wave SGR1 is large as the amplitude of the voltage increase (dV/dt) per unit time is large.

The other part of the signals flowing to the equalizer circuits EQC1 is reflected by the low-impedance resistor elements PER to generate reflected waves SGR2.

Since the reflected wave SGR2 is generated by reflection at the low-impedance resistor element PER, the transition direction of the reflected wave SGR2 is opposite to the transition direction of the wave form of the signal SG1, as shown in FIG. 9.

In other words, if the transition direction of the waveform of the signal SG1 is a positive direction, the transition direction of the reflected wave SGR2 is a negative direction.

The reflected wave SGR2 reaches the input/output circuits IOP2 with a delay with respect to the signals SG1 and the reflected wave SGR1.

As shown in FIG. 9, the signal SG1, the reflected wave SGR1, and the signal SGA, which is a combined wave of the reflected wave SGR2, are input to the input/output circuits IOP2.

Comparing the time from the low-side reference value (e.g., 0 volts) until the voltage reaches the high-side reference value (referred to as the boost time), the boost time of the signal SGA, which is the composite wave, is shorter than the boost time of the signal SG1, which is the original signal.

That is, by connecting the equalizer circuit EQC1 to the signal transmission path SGP, the rise of the waveform of the signal SGA input to the input/output circuit IOP2 becomes steeper than the rise of the waveform of the signal SG1.

As a result, the edge of the signal waveform is emphasized. In addition, since the aperture width of the eye pattern in the time axis direction becomes large, the quality of the signal can be improved.

Apart from the correction of the signal waveform shown in FIGS. 8 and 9, there is a method for improving the waveform quality of a signal by amplifying the amplitude of the signal waveform.

As described above, in the PAM4, since the eye opening corresponding to the four values is smaller in magnitude than the eye opening corresponding to the two values, the gain amplification is particularly effective.

As the signal correction circuit for amplifying the gain of the signal, for example, an amplifier circuit such as an inverter circuit can be considered.

However, when the gain of a signal is to be amplified by an inverter circuit, it is necessary to incorporate active elements such as transistors in each of the signal transmission paths.

In the case of an active element such as a transistor, it is necessary to supply a power source for driving the active element itself separately from a signal.

In this case, the structure of the signal correction circuit is complicated.

Further, since the power for signal correction is consumed, the power consumption of the semiconductor device as a whole increases.

For example, when the equalizer circuit EQC1 shown in FIG. 8 and the inverter circuit for amplifying the gain of the signal are formed in the semiconductor chip CHP1 shown in FIG. 6, a space for forming the equalizer circuit EQC1 and the inverter circuit and a space for forming the power supply path for supplying the drive voltage to the inverter circuit are required for each signal transmission path.

In this instance, the surface area of the semiconductor chip CHP1 (the surface area of the semiconductor chip $3t$ shown in FIG. 6) increases.

When the planar area of the semiconductor chip CHP1 is increased, the number of semiconductor chips CHP1 that can be obtained from one semiconductor wafer is decreased, so that the manufacturing efficiency of the semiconductor chip CHP1 is decreased.

In addition, the power consumed by the semiconductor chip CHP1 increases.

Further, for example, when the equalizer circuit EQC1 shown in FIG. 8 and the invertor circuit for amplifying the gain of signals are formed in the chip component CHP3 shown in FIG. 7, the chip component CHP3 is increased in size.

Further, in addition to a path for inputting or outputting signals to or from the chip component CHP3, a power supplying path for driving the inverter circuits is required.

Therefore, in the wiring substrate SUB1 (see FIG. 3), the wiring structures connected to the chip components CHP3 are complicated, and it is difficult to arrange a plurality of signal transmission paths at high density.

Therefore, the inventor of the present application has examined a method of amplifying the gain of a signal without using an active element such as a transistor and has found technologies described in this embodiment.

That is, as shown in FIG. 1, in the semiconductor device PKG1 or the present embodiment, the equalizer circuits EQCs are formed on a chip component CHP3 different from that of the semiconductor chip CHP1.

Like the equalizer circuit EQC1 described with reference to FIGS. 8 and 9, the equalizer circuit EQC is composed of a plurality of passive elements PE (see FIG. 7), and the equalizer circuit EQC itself does not have a function of amplifying the gain of signals.

However, in the semiconductor device PKG1, the path length of the signal transmission path for electrically connecting the signal electrodes Tx (see FIG. 2) of the semiconductor chip and the electrodes (electrode pads) 4PD1 (see FIG. 7) of the chip component CHP3 is $1/16$ or more and 3.5/16 or less with respect to the signal wavelengths.

In this instance, the gain of the signal can be amplified by utilizing the parasitic capacitance around the signal electrode Tx of the semiconductor chip CHP1 and the parasitic capacitance around the electrode 4PD of the chip component CHP3.

Figure 10:
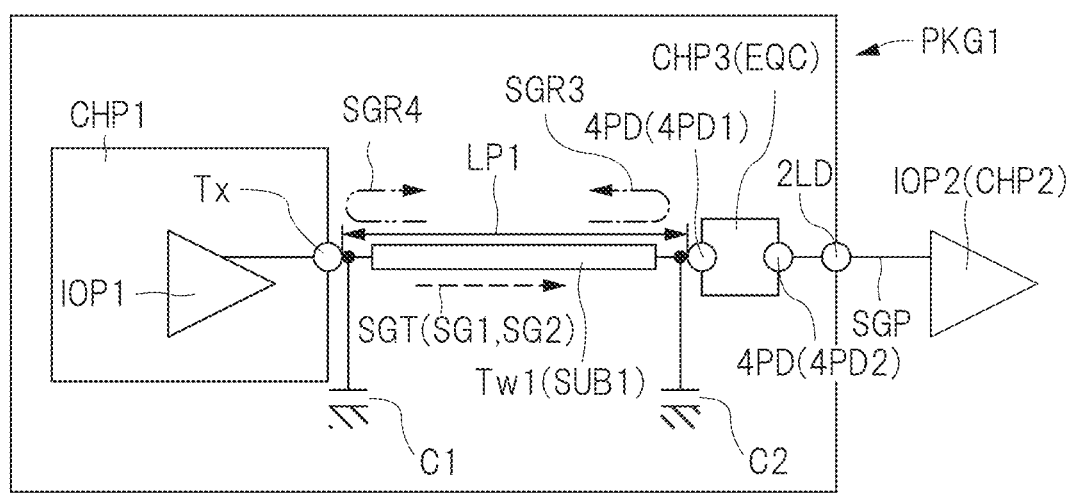
FIG. 10 is an explanatory diagram showing an image of a circuit for amplifying a gain of a signal by using reflection of a signal at an electrode pad of a semiconductor chip or an electrode pad of a chip component.

FIG. 10 is an explanatory diagram showing an image of a circuit for amplifying a gain of a signal by using reflection of a signal at an electrode pad of a semiconductor chip or an electrode pad of a chip component.

Figure 11:
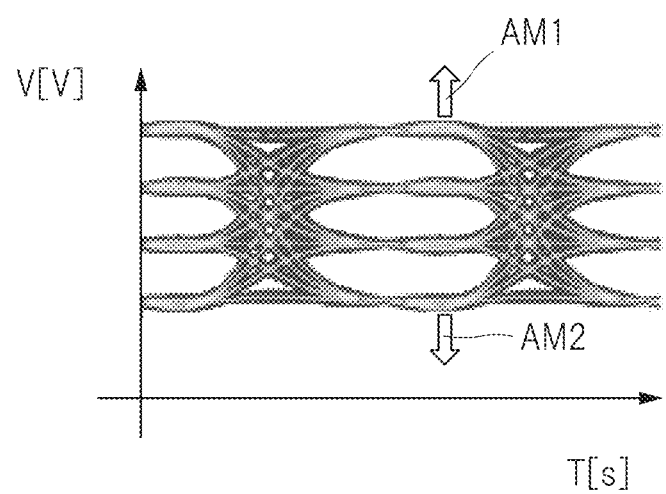
FIG. 11 is an explanatory view showing an image in which the width of a part of the eye pattern is increased by the amplifier circuit shown in FIG. 10.

FIG. 11 is an explanatory view showing an image in which the width of a part of the eye pattern is increased by the amplifier circuit shown in FIG. 10.

In FIG. 11, the vertical axis represents the voltage V, and the horizontal axis represents the time T.

In the present embodiment, as shown in FIG. 10, the signal electrode Tx of the semiconductor chip CHP1 and the electrode 4PD of the chip component CHP3 are electrically connected to each other via the wiring Tw1 of the wiring substrate SUB1.

Assuming that the wavelength of the signal SG1 flowing through the wire 2d is λ, the path distance LP1 from the signal electrode Tx of the semiconductor chip CHP1 to the electrode 4PD of the chip component CHP3 is equal to or greater than λ/16 and equal to or less than 3.5 λ/16.

The electrodes (electrode pads) Tx included in the semiconductor chip CHP1 shown in FIG. 10 are electrically connected to the input/output circuit IOP1 (the output control circuit in FIG. 10), and constitute a part of the signal transmission path SGP for transmitting the signal SG1.

The chip component CHP3 includes an equalizer circuit EQC for correcting signal waveforms of the signal SG1, and electrodes 4PD electrically connected to the equalizer circuit EQC.

A parasitic capacitance C1 is formed in the vicinity of the signal electrode Tx, and a parasitic capacitance C2 is formed in the vicinity of the electrode 4PD.

The parasitic capacitances C1 and C2 include not only the signal electrodes Tx and 4PD but also capacitances formed by the protrusion electrodes 3BP and 4BP (see FIG. 14 to be described later) and the terminals 2PD and 5PD (see FIG. 14 to be described later) connected to the signal electrodes Tx and 4PD.

Although not shown in FIG. 10, the input/output circuit IOP1 is connected to a core circuit included in the semiconductor chip CHP1.

As the core circuit, for example, an arithmetic processing circuit or the like can be exemplified.

The signal SG1 output from the I/O circuit IOP1 reflects a portion of the signal SG1 near the electrode 4PD due to the parasitic capacitance C2 and generates a reflective wave SGR3.

In the case of capacitive reflection, a reflected wave of opposite phase to the input wave is generated.

The reflected waves SGR3 are therefore in phase opposition to the signals SG1.

In addition, part of the reflected wave SGR3 is reflected again in the vicinity of the signal electrode Tx due to the parasitic capacitance C1, and a reflected wave SGR4 is generated in the vicinity of the signal electrode Tx.

Since the reflected wave SGR4 is a capacitive reflected wave, it is opposite in phase to the phase of the reflected wave SGR3.

That is, the SGR4 of the re-reflected wave is in phase with the signal SG1 of the signal SG1 of the signal SG1 and the signal SG1 of the signal SG1 and the signal SG1 of the signal SG1 and the signal SG1 of the signal SG1, respectively.

Therefore, if the reflected wave SGR4 is generated within the unit time for forming the opening of the eye pattern shown in FIG. 11, the shape of the eye pattern is amplified toward the voltage V in the unit time during which the signal SG1 (see FIG. 10) and the reflected wave SGR4 overlap each other.

When the signal SG1 shown in FIG. 10 is a signal having a waveform for increasing the voltage, for example, "0V to 3V", a part of the waveform is pushed up in a direction for further increasing the voltage, as shown by an arrow AM1 in FIG. 11, as compared with a case where the reflected wave SGR3 and the reflected wave SGR4 are not generated.

On the other hand, when the signal SG1 shown in FIG. 10 is a signal having a waveform for lowering the voltage, for example, "3V to 0V", a part of the waveform is pushed up in a direction for further lowering the voltage, as shown by an arrow AM2 in FIG. 11, as compared with a case where the reflected wave SGR3 and the reflected wave SGR4 do not occur.

As described above, according to the signal correction circuit shown in FIG. 10, the waveform of the signal SG1 (see FIG. 1) can be corrected so as to widen the height direction (voltage direction) of the eye opening without using a passive element requiring a driving power source.

According to the present embodiment, since the amplifying circuit is formed by devising the positional relation between the semiconductor chip CHP1 and the chip component CHP1, it is not necessary to provide the amplifying circuit in the semiconductor chip CHP1 or the chip component CHP3.

Therefore, the occupied area of the signal correction circuit can be reduced.

According to the present embodiment, a dedicated power supply for driving the amplifying circuit is not required, and the voltage is amplified using the reflected wave of the signal.

Therefore, power consumption can be reduced as compared with the case where an amplifier circuit such as an inverter circuit is used.

As shown in FIG. 7, the chip component CHP3 includes equalizer circuits EQCs composed of a plurality of passive elements PEs, and does not include active elements.

Therefore, the chip component CHP3 need only include electrodes for inputting or outputting signals, and does not need electrodes for supplying a power supply potential or a reference potential.

Therefore, since the electrode layout of the chip part CHP3 can be simplified, the chip part CHP3 can be inserted into each signal transmission path SGP even when multiple signal transmission paths SGP (see FIG. 2) are implemented at high density.

The layouts of the signal transmission paths to the chip component CHP3 will be described later.

Next, an exemplary layout of a signal transmission path for electrically connecting the semiconductor chip CHP1 and the chip component CHP3 constituting the amplifier shown in FIG. 10 will be described.

Figure 12:
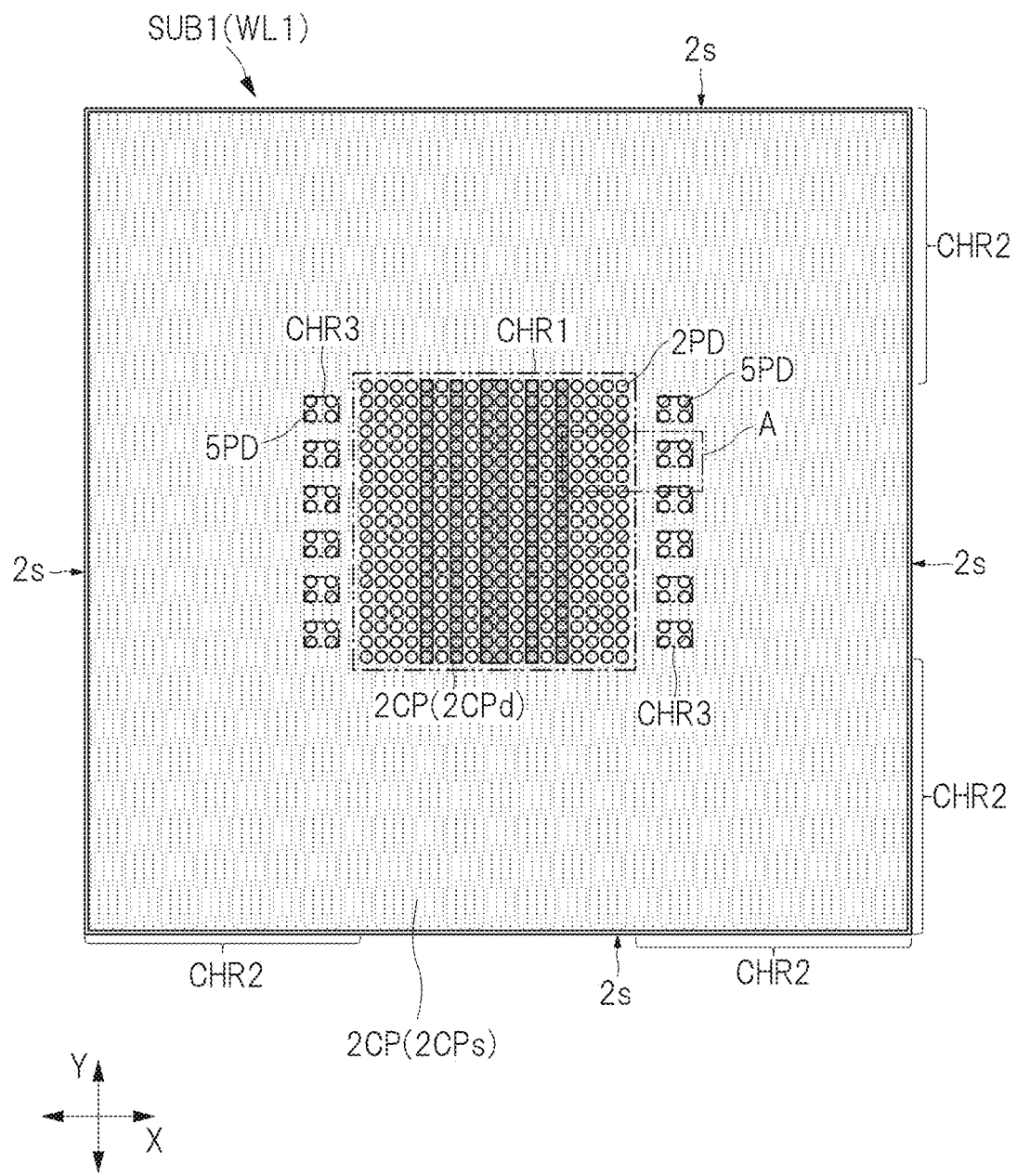
FIG. 12 is plan view showing a state in which the insulating film of the uppermost layer of the wiring substrate shown in FIG. 3 is removed.

FIG. 12 is plan view showing a state in which the insulating film of the uppermost layer of the wiring substrate shown in FIG. 3 is removed.

Figure 13:
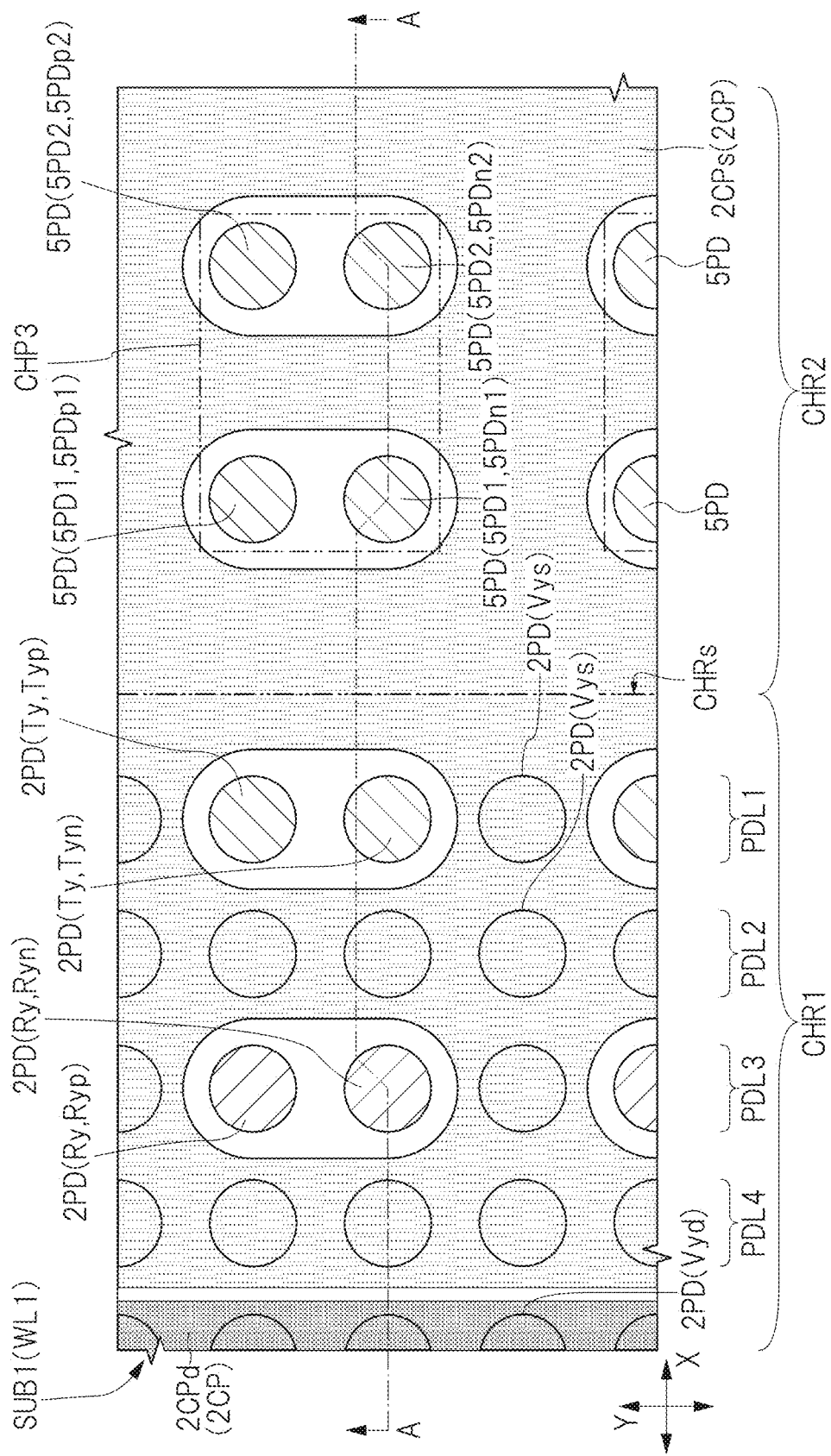
FIG. 13 is An enlarged plan view of A portion of FIG. 12.

FIG. 13 is an enlarged plan view of part A of FIG. 12.

FIG. 14 is an enlarged cross-sectional view taken along line A-A of FIG. 13.

Figure 15:
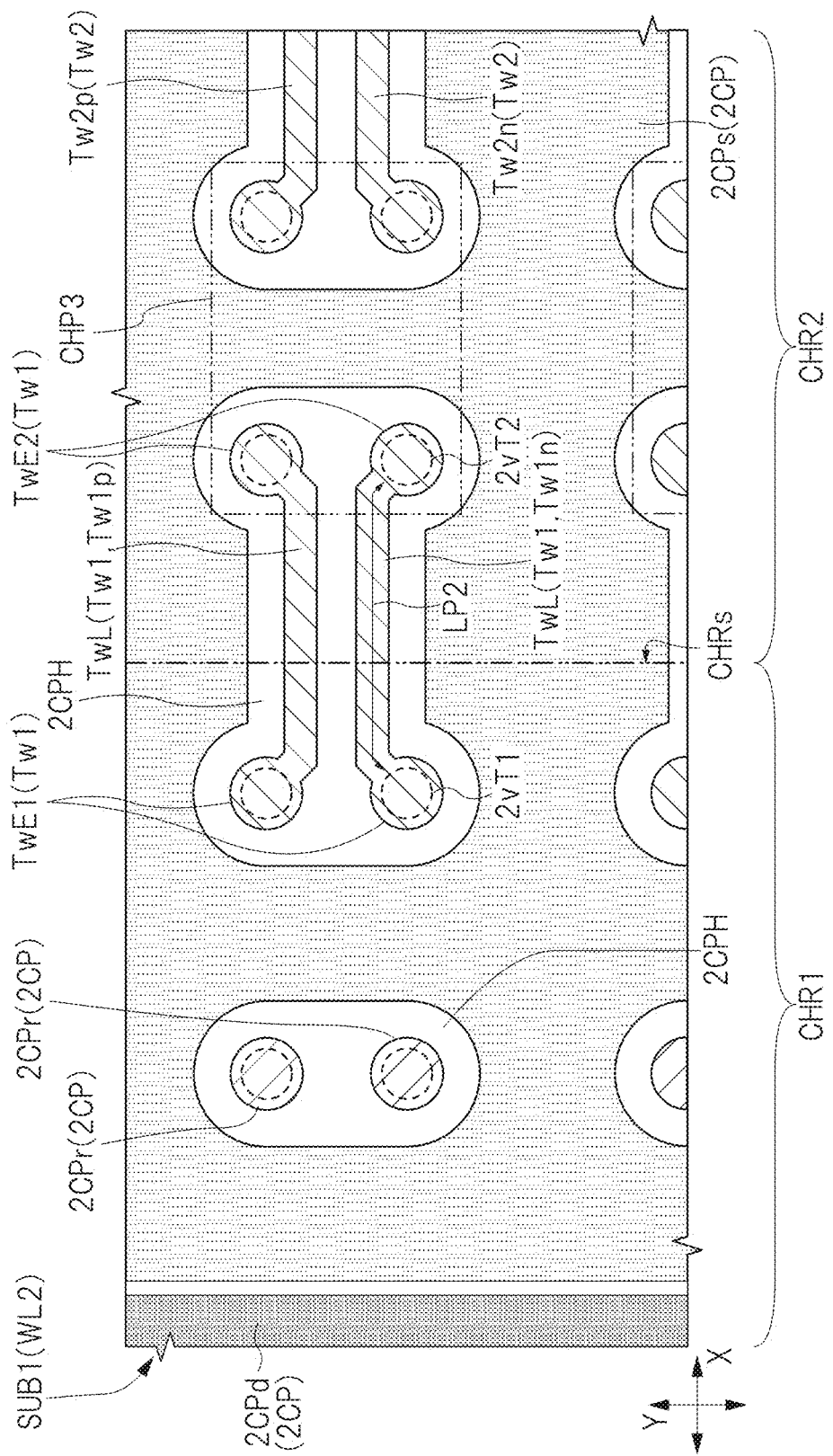
FIG. 15 is an enlarged plan view of the second wiring layer of the wiring substrate shown in FIG. 13.

FIG. 15 is an enlarged plan view of the second wiring layer of the wiring substrate shown in FIG. 13.

Figure 16:
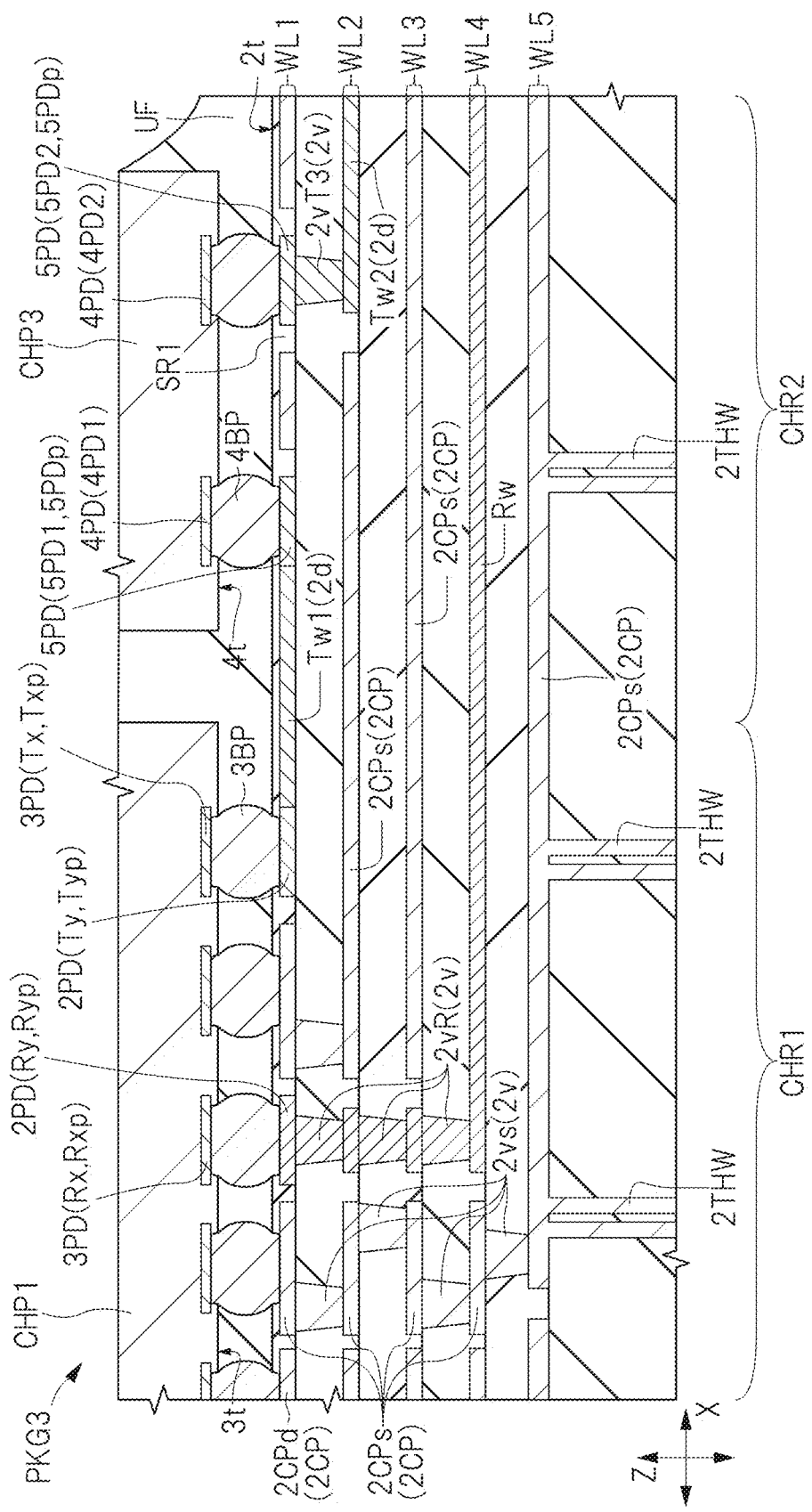
FIG. 16 is an enlarged cross-sectional view of a semiconductor device as a modification to FIG. 14.

FIG. 16 is an enlarged cross-sectional view of a semiconductor device as a modification to FIG. 14.

Each of the plurality of wiring layers of the wiring substrate SUB1 shown in FIG. 14 has a region (chip overlapping region) CHR1 (see FIG. 12) overlapping with the semiconductor chip CHP1 and a region (chip non-overlapping region) CHR2 (see FIG. 12) surrounding the region CHR1 and not overlapping with the semiconductor chip CHP1.

In FIG. 12, FIG. 13, and FIG. 15, the side CHRs, which is the border between the region CHR1 and the region CHR2, is indicated by a two-dot chain line.

In FIG. 12, FIG. 13, and FIG. 15, in order to distinguish the types of signals and potentials supplied to the respective transmission paths, the conductor patterns are hatched and patterned according to the same rules as in FIG. 6.

In FIGS. 13 and 15, the outline of the chip component CHP3 in plan view is indicated by a two-dot chain line.

As shown in FIGS. 12-14, the wiring substrate SUB1 has a plurality of terminals 2PD electrically connected to a semiconductor chip CHP1 (see FIG. 5).

Each of the plurality of terminals 2PD is provided in the wring layer WL1 closest to the chip-mounting surface among the plurality of wiring layers provided in the wiring substrate SUB1, and opposes each of the plurality of electrodes 3PD shown in FIG. 6.

Each of the plurality of terminals 2PD is arranged in a region (chip overlap region) CHR1 of the upper surface 2t of the wiring substrate SUB1 that overlaps with the semiconductor chip CHP1 (see FIG. 6) in plan view, and is not outside the region CHR1.

The plurality of terminals 2PD of the wiring substrate SUB1 includes a plurality of terminals (input signal terminals) Ry to which input signals (signals SGRs shown in FIG. 1) input to the semiconductor chips CHP1 (see FIG. 6) are transmitted.

Each of the plurality of terminals Ry faces the plurality of signal electrodes Rx shown in FIG. 6.

The plurality of terminals 2PD includes a plurality of terminals (output signal terminals) Ty to which output signals (signals SGTs shown in FIG. 1) output from the semiconductor chip CHP1 are transmitted.

Each of the plurality of terminals Ty faces the plurality of signal electrodes Tx shown in FIG. 6.

The plurality of terminals 2PD includes a plurality of terminals (reference potential terminals) Vys for supplying the reference potent VSS (see FIG. 2) to the semiconductor chip CHP1, and a plurality of terminals (power supply potential terminals) Vyd for supplying the power supply potential VDD (see FIG. 2) differing from the reference potential VSS to the semiconductor chip CHP1.

In the case of the present embodiment, each of the signal SGT and the signal SGR shown in FIG. 1 is a differential signal. Therefore, the terminal Ry includes a terminal Ryp and a terminal Ryn from which a pair of differential signals are output.

As shown in FIG. 13, the terminals Ryp and Ryn constituting the differential pair are arranged so as to be adjacent to each other along the Y direction which is the arrangement direction of the plurality of terminals Ry.

The terminal Ty includes a terminal Typ to which a pair of differential signals are input and a terminal Tyn. The terminals Typ and Tyn constituting the differential pair are arranged so as to be adjacent to each other along the Y direction which is the arrangement direction of the plurality of terminals Ty.

As shown in FIG. 13, in the X direction, the plurality of signal electrodes Tx and the plurality of signal electrodes Rx are arranged in mutually different columns.

In the embodiment shown in FIG. 13, a plurality of terminals Ty is arranged on the upper surface 2t of the wiring substrate SUB1 in the row (first row) PDL1 between the outer edge (side CHRs) of the region CHR1 in the X-direction and the center of the region CHR1.

In the X-direction, a plurality of terminals Vys is arranged in a column PDL2 between the column PDL1 and the center of the area CHR1.

In the Y-direction, a plurality of terminals Ry is arranged in a column (third row) PDL3 between the column PDL2 and the center of the region CHR1.

Since the input terminal Ry and the output terminal Ty are arranged in mutually different columns as in the present embodiment, the layout of the wiring in the wiring board can be simplified, and the crosstalk noise of the output signal and the input signal can be reduced.

In the present embodiment, among the plurality of terminals 2PD, the output terminal Ty is electrically connected to the chip part CHP3 (see FIG. 5), and the input terminal Ry is not connected to the chip part CHP3.

Therefore, the outputting terminals Ty are arranged in a column PDL1 closer to the area CHR2 than the inputting terminals Ry.

In the present embodiment, a signal correction circuit for amplifying a voltage is configured by controlling a path distance between the signal electrode Tx and the electrode 4 PD1 shown in FIG. 10.

In this instance, as shown in FIG. 13, it is easier to control the path length of the signal transmission path if the terminals Ty connected to the signal electrodes Tx (see FIG. 14) are in the column PDL1.

As shown in FIG. 13, in each of the plurality of terminals Ty and the plurality of terminals Ry, each of the terminals 2PD is separated from other conductor patterns.

On the other hand, the plurality of terminals Vys is connected to each other via a large-area conductor pattern 2CPs. In other words, the plurality of terminals Vys is portions exposed from the insulating layer SR1 in the opening portion provided in the insulating layer SR1 covering the conductor pattern 2CPs in the conductor pattern 2CPs having an area larger than that of the terminals Ty and Ry.

The plurality of terminals Vyd is connected to each other via a large-area conductor pattern 2CPd.

In other words, the plurality of terminals Vyd is portions of the conductor pattern 2CPd having an area larger than that of the terminals Ty and Ry that are exposed from the insulating layer SR1 in the opening portion provided in the insulating layer SR1 covering the conductor pattern 2CPd (see FIG. 14).

In the case of a path for supplying the power supply potential or the reference potential, the same potential is supplied to the plurality of terminals 2PD.

In this case, the terminals 2PD arranged adjacent to each other and supplied with the same potential are electrically connected to each other to form the conductor pattern 2CP having a large area, whereby power can be stably supplied.

As shown in FIGS. 12 to 14, the wiring substrate SUB1 has a plurality of terminals 5PD electrically connected to the chip component CHP3 (see FIG. 5).

Each of the plurality of terminals 5PD is provided in the wring layer WL1 closest to the chip-mounting surface among the plurality of wiring layers provided in the wiring substrate SUB1, and opposes each of the plurality of electrodes 4PD shown in FIG. 7.

Each of the plurality of terminals 5PD is arranged in a region CHR3 (see FIG. 12) that overlaps with the chip component CHP3 (see FIG. 7) on the top surface 2t of the wiring substrate SUB1 in plan view, and is not in the region CHR1.

The region CHR3 shown in FIG. 12 is a part of the region CHR2.

As shown in FIG. 12, a plurality of conductor patterns 2CP is formed in the wiring layer WL1.

Of the plurality of conductor patterns 2CP, 2CPs to which the reference potential is supplied has the largest area among the plurality of conductor patterns formed in the wiring layer WL1.

In plan view, it is disposed so as to cover most of the area CHR2.

Part of the conductive patterns 2CPs is also arranged in the area CHR1.

Each of the plurality of wiring layers of the wiring substrate SUB1 includes a region (chip overlapping region) CHR1 overlapping with the semiconductor chip CHP1 (see FIG. 6) and a region (chip non-overlapping region, peripheral region) CHR2 surrounding the region CHR1 and not overlapping with the semiconductor chip CHP1.

Each of the plurality of signal transmission paths is led out from the region CHR1 to the region CHR2 in any of the plurality of wiring layers.

In the present embodiment, a plurality of signal transmission paths for outputting signals and a plurality of signal transmission paths for inputting signals are led out from the region CHR1 to the region CHR2 in mutually differing interconnection layers.

As shown in FIG. 14, the plurality of wiring layers of the wiring substrate SUB1 includes a wiring layer WL1 between the upper surface 2t and the lower surface 2b, a wiring layer WL2 between the wiring layer WL1 and the lower surface 2b, a wiring layer WL3 between the wiring layer WL2 and the lower surface 2b, a wiring layer WL4 between the wiring layer WL3 and the lower surface 2b, and a wiring layer WL5 between the wiring layer WL4 and the lower surface 2b.

The plurality of signal transmission paths of the output signal is led out from the region CHR1 to the region CHR2 in the wiring layer WL2.

The plurality of signal transmission paths of the input signal is led out from the region CHR1 to the region CHR2 in the wiring layer WL4.

More specifically, the wiring substrate SUB1 includes wirings (output signal wirings, signal wirings, and signal lines) Tw1 formed on the wiring layers WL2 and connected to the signal electrodes Tx.

The signal transmission path of the output signal is taken out from the region CHR1 to the region CHR2 through the wiring Tw1 in the wiring layer WL2.

The wiring substrate SUB1 is formed on the wiring layers WL4 and includes wirings (input signal wirings, signal wirings, and signal lines) Rw connected to the signal electrodes Rx.

The signal transmission path of the input signal is taken out from the region CHR1 to the region CHR2 through the wiring line Rw in the wiring line WL4.

Each of the wiring Tw1 and the wiring Rw extends so as to straddle the border between the region CHR1 and the region CHR2 in plan view.

The wire Tw1 is electrically connected to the signal electrode Tx of the semiconductor chip CHP1 via the via 2vT1 and the terminal Ty, and is electrically connected to the electrode 4PD1 of the chip component CHP3 via the via 2vT2, the terminal 5PD1, and the projection electrode 4BP.

By controlling the length of the line Tw1, the path length LP1 from the signal electrode Tx of the semiconductor chip CHP1 to the electrode 4PD of the chip component CHP3 can be adjusted to be 1/16 or more and 3.5/16 or less with respect to the wavelength of the signal SG1, as described with reference to FIG. 10.

The operation of the signal amplification described with reference to FIG. 10 is applied to the structure shown in FIG. 14, and can be described as follows.

That is, the signal SG1 output from the signal electrode Tx of the semiconductor chip CHP1 (see FIG. 10) reaches the terminal 5PD1 through the protruding electrode 3BP, the via 2vT1, the wiring Tw1, and the via 2vT2.

Here, a part of the signal SG1 is reflected by the parasitic capacitance C2 (see FIG. 10) of the electrode 4PD1, the protrusion electrode 4BP, and the terminal 5PD1, and the reflected wave SGR3 (see FIG. 10) is transmitted from the line Tw1 to the via 2vT1.

Next, a part of the reflected wave SGR3 is reflected again by the parasitic capacitance C1 (see FIG. 10) of the signal electrode Tx, the projection electrode 3BP, and the terminal Ty, and the reflected wave SGR4 (see FIG. 10) is transmitted from the line Tw1 toward the via 2vT2.

At this time, when the wavelength of the signal SG1 is $\lambda$, the path distance LP1 (see FIG. 10) is equal to or greater than $\lambda/16$ and equal to or less than $3.5 \lambda/16$.

Therefore, the waveform of the reflected wave SGR4 is delayed from the waveform of the signal SG1 by the time required to propagate the signal at distances of $\lambda/8$ to $3.5 \lambda/8$, and the signal SG1 is a re-reflected wave shifted in phase by 45 degrees to 157.5 degrees.

The waveform of the signal SG1 is amplified by combining the waveform of the signal SG1 and the waveform of the reflected wave SGR4.

In the case of the present embodiment, as shown in FIGS. 14 and 15, the wiring Tw1 is arranged in the wiring layer WL2. As shown in FIG. 15, each of the plurality of wirings Tw1 has an end portion (via land) TwE1, an end portion (via land) TwE2, and an extension portion TwL between the end portion TwE1 and the end portion TwE2 and extending in the X-direction.

The end TwE1 and the end TwE2 are circular in the embodiment shown in FIG. 15, more specifically, a part of the circle is connected to the extension TwL.

The via 2vT1 is connected to the end TwE1 of the interconnect Tw1n.

The via 2vT2 is connected to the end TwE2 of the interconnect Tw1n.

When the vias 2vT1 and 2vT2 shown in FIG. 15 are interposed between the signal electrodes Tx and the electrodes 4PD1 constituting the gain amplifier circuits shown in FIG. 10, the signal may be reflected by the via lands (end portions TwE1 and TwE2) to which the vies 2vT1 and 2vT2 are connected, or the capacitive components of the vias 2vT1 and 2vT2 themselves.

As described above, considering reflections of signals by the vias 2vT1 and 2vT2 and via lands, the path length LP2 from the end TwE1 to the end TwE2 of the wire Tw1 is preferably 1/16 or more and less than 3.5/16 with respect to the wavelength of the signal SG1 (see FIG. 10).

For example, when the frequency of the signal SG1 is 14 GHz and the relative dielectric constant of the dielectric around the signal transmission path is 4, the wavelength $\lambda$ is about 10.7 mm, and therefore the path distance LP2 is preferably about 0.67 mm or more and less than 2.34 mm.

Further, for example, when the frequency of the signal SG1 is 25.6 GHz and the relative dielectric constant of the dielectric around the signal transmission path is 4, the wavelength $\lambda$ is about 5.85 mm, so that the path distance LP2 is preferably about 0.36 mm or more and less than 1.28 mm.

Assuming that the relative permittivity of the dielectric is $\varepsilon r$, the wavelength $\lambda$ is shortened by a ratio of $1/(\varepsilon r)^{1/2}$ with respect to the case where $\varepsilon r=1$ due to the influence of the dielectric.

In the case of the path distance LP1 described with reference to FIG. 10, the path distance LP1 may be 3.5/16 or less with respect to the wavelength of the signal SG1. However, considering the wiring path distance connecting the wiring Tw1 illustrated in FIG. 14 to the signal electrodes Tx and 4PD1, such as the thickness of the via 2vT1 and 2νT2, the path distance LP2 illustrated in FIG. 15 is preferably less than 3.5/16 with respect to the wavelength of the signal SG1.

Although illustration is omitted, as a modification to the present embodiment, the wiring Tw1 may be arranged in the wiring layer WL3 or the wiring layer WL4.

Even in this case, the path distance LP1 shown in FIG. 10 can be adjusted by controlling the length of the wiring Tw1.

However, in this case, a plurality of vias 2v is required to electrically connect the wiring layer WL1 to the wiring layer WL3 or the wiring layer WL1 to the wiring layer WL4.

In this case, since the capacitance component of the via 2v (and the via land) connecting the wiring layers becomes large, it is necessary to consider reflection due to the capacitance component of the via 2v (and the via land).

Therefore, from the viewpoint of facilitating the adjustment of the path length LP1 shown in FIG. 10, it is preferable that the number of vias 2v included in the signal transmission path from the signal electrode Tx of the semiconductor chip CHP1 to the electrode 4PD of the chip component CHP3 is small.

As another modification, there is an embodiment in which the wiring Tw1 is arranged in the wiring layer WL1 and the terminal Ty and the terminal 5PD1 are connected only by the wiring layer WL1, as in the semiconductor device PKG3 shown in FIG. 16.

Since the via 2v is not included in the signal transmission path from the signal electrode Tx of the semiconductor chip CHP1 to the electrode 4PD of the chip component CHP3, the signal is easily designed to be reflected.

However, in the semiconductor device PKG1, since the wiring Tw1 is formed in the uppermost wiring layer WL1, the wiring structure of the wiring Tw1 is a so-called microstrip line structure.

On the other hand, as shown in FIG. 14, in the semiconductor device PKG1, the wiring Tw1 is formed in the wiring layer WL2, and is sandwiched between the conductor pattern 2CPs of the wiring layer WL1 and the conductor pattern 2CPs of the wiring layer WL3.

In the thickness of the wiring substrate SUB1, the wiring layer WL1 and the wiring layer WL3 are wiring layers adjacent to the wiring layer WL2.

In other words, there is no other wiring layer between the wiring layer WL1 and the wiring layer WL2, and between the wiring layer WL2 and the wiring layer WL3.

Therefore, the wiring structure of the wiring Tw1 in the semiconductor device PKG1 is a strip line structure.

A strip line structure is preferable to a microstrip line structure from the viewpoint of suppressing spread of electromagnetic waves generated when a signal current flows through a signal wiring.

In particular, when the PAM4 is used as in the present embodiment, it is essential to suppress degradation of signal waveforms.

From the viewpoint of suppressing the degradation of the signal waveform, it is particularly preferable that the wiring Tw1 has a strip line structure as in the semiconductor device PKG1.

The wiring layers WL1, WL2, WL3, WL4, and WL5 are each provided with a conductor pattern 2CPs, which is a large-area conductor pattern supplied with a reference potential and electrically connected to each other.

The conductor patterns 2CPs the wiring layers are electrically connected to each other through vias 2vs.

In the present embodiment, each of the wiring lines Tw1, Tw2, and Rw constituting the signal-transmission path is sandwiched between the conductor patterns 2CPs to which the reference potential is supplied in the thickness direction of the wiring substrate SUB1, that is, the normal direction of the upper surface 2t and the Z direction of FIG. 14.

More specifically, the wiring Tw1 and the wiring Tw2 are sandwiched between the conductor pattern 2CPs of the wiring layer WL1 and the conductor pattern 2CPs of the wiring layer WL3.

The wiring Rw is sandwiched between the conductor pattern 2CPs of the wiring layer WL3 and the conductor pattern 2CPs of the wiring layer WL5.

In other words, each of the wiring Tw1, the wiring Tw2, and the wiring Rw constituting the signal transmission path has a wiring structure of a split line.

Therefore, the electromagnetic wave output from each of the signal transmission paths is shielded by the conductor pattern 2CPs, so that the influence of the crosstalk noise between the signal transmission paths can be reduced.

As shown in FIG. 15, a conductor pattern 2CPs to which a reference potential is supplied is arranged in be wiring layer WL2.

An opening portion 2CPH is provided in the conductor pattern 2CPs of the wiring layer WL2.

In plan view, the wiring Tw1 is arranged in the opening portion 2CPH so as to be separated from the conductor pattern 2CPs.

In the present embodiment, since the wiring Tw1 constitutes a differential pair, the wiring Tw1$p$ to which one signal of the differential pair is transmitted, the wiring Tw1$n$ to which the other signal of the differential pair is transmitted, and the conductor patterns 2CPs to which the reference potential is supplied are arranged in the wiring layers WL2.

In plan view, in plan view, the wring Tw1$p$ and the wiring Tw1$n$ are arranged in the opening portion 2CPH so as to be separated from the conductive patterns 2CPs and adjacent to each other.

The conductive patterns 2CPs are not arranged between the wiring Tw1$p$ and the wiring Tw1$n$ constituting the differential pair.

As shown in FIG. 15, when the conductor pattern 2CPs is arranged so as to surround the periphery of the wiring Tw1 constituting the signal transmission path, it is possible to suppress the spread of the electromagnetic wave around the wiring Tw1.

Therefore, the influence of the crosstalk noise between the signal transmission paths can be reduced.

As described above, in the present embodiment, a differential signal is transmitted to the wiring Tw1.

As shown in FIG. 10, the signal transmitted by the semiconductor chip CHP1 includes a signal SG2 paired with the signal SG1 and constituting a differential signal.

The signal SG1 and the signal SG2 are inputted to the chip component CHP3.

For example, in the example of the chip component CHP3 shown in FIG. 7, the signal SG1 is input to the electrode 4PDn1, and the signal SG2 is input to the electrode 4PDp1.

The equalizer circuit EQC shown in FIG. 10 corrects the signal waveform of the signal SG1 and the signal waveform of the signal SG2.

The signals SG1 corrected by the equalizer circuits EQC are outputted from the electrodes 4PDn2.

The signals SG2 corrected by the equalizer circuits EQC are outputted from the electrodes 4PDp2.

As shown in FIG. 6, the semiconductor chip CHP1 includes an electrode (electrode pad) Txn disposed on the surface 3t and transmitting a signal SG1 (see FIG. 10), and an electrode (electrode pad) Txp disposed on the surface 3t and transmitting a signal SG2 (see FIG. 10).

The equalizer circuits EQCs of the chip component CHP3 shown in FIG. 7 are electrically connected to the signal electrodes Txn and Txp shown in FIG. 6.

The chip component CHP3 has an electrode (electrode pad) 4PDn1 which is disposed on the front surface 4t and to which a signal SG1 (see FIG. 10) is inputted, and an electrode (electrode pad) 4PDn2 which outputs a signal SG1 corrected by the equalizer circuit EQC.

The chip component CHP3 has an electrode (electrode pad) 4PDp1 arranged on the front surface 4t and to which a signal SG2 (see FIG. 10) is inputted, and an electrode (electrode pad) 4PDp2 from which a signal SG2 corrected by the equalizer EQC is outputted.

The wiring layers WL1 on the wiring substrate SUB1 shown in FIG. 13 have a terminal Tyn electrically connected to the signal electrode Txn (see FIG. 6) of the semiconductor chip CHP1 (see FIG. 6) via the projection electrode 3BP (see FIG. 14), and a terminal Typ electrically connected to the signal electrode Txp (see FIG. 6) of the semiconductor chip CHP1 via the projection electrode 3BP.

The wiring layers WL1 on the wiring substrate SUB1 have a terminal 5PDn1 electrically connected to the electrode 4PDn1 (see FIG. 7) of the chip component CHP3 (see FIG. 7) via the projection electrode 4BP (see FIG. 14), and a terminal 5PDp1 electrically connected to the electrode 4PDp1 (see FIG. 7) of the chip component CHP3 via the projection electrode 4BP.

The wiring layers WL1 of the wiring substrate SUB1 have a terminal 5PDn2 electrically connected to the electrode 4PDn2 (see FIG. 7) of the chip component CHP3 via the projection electrode 4BP, and a terminal 5PDp2 electrically connected to the electrode 4PDp2 (see FIG. 7) of the chip component CHP3 via the projection electrode 4BP.

The wiring layers WL2 of the wiring substrate SUB1 shown in FIG. 15 include a wiring Tw1n electrically connected to the terminal 5PDn1 (see FIG. 13) and the terminal 5Tyn (see FIG. 13), and a wiring Tw1p electrically connected to the terminal 5PDp1 (see FIG. 13) and the terminal 5Typ (see FIG. 13).

The path length from the signal electrode Txn of the semiconductor chip CHP1 to the electrode 4PDn1 of the chip component CHP3 is 1/16 or more and 3.5/16 or less with respect to the wavelength of the signal SG1.

The path length from the signal electrode Txp of the semiconductor chip CHP1 to the electrode 4PDp1 of the chip component CHP3 is 1/16 or more and 3.5/16 or less with respect to the wavelength of the signal SG2.

Note that the signal SG1 and the signal SG2 are differential signals as described above, and the wavelengths thereof are equal each other.

Therefore, the path distance from the signal electrode Txn to the electrode 4PDn1 and the path distance from the signal electrode Txp to the electrode PDp1 are equal each other.

Next, the operation of correcting the signal waveform of the signal SG1 and the signal waveform of the signal SG2 will be described with reference to the circuit diagram shown in FIG. 7 and the circuit diagram shown in FIG. 8.

As shown in FIG. 7, the chip component CHP3 has a differential signal transmission path DSn through which the signal SG1 is transmitted, and a differential signal transmission path DSp through which the signal SG2 is transmitted.

The differential signal transmission path DSn and the differential signal transmission path DSp are electrically connected to each other via a plurality of passive elements PE connected in series.

The resistive element PER1, the inductor element PEL, and the resistive element PER2 are connected in series in this order from the differential signal transmission path DSn side to the differential signal transmission path DSp side.

The impedance of the resistive element PER1 and the impedance of the resistive element PER2 are the same, and the impedance of the inductor element PEL is larger than the impedance of the resistive elements PER1 and PER2.

With such a configuration, a correcting process equivalent to the equalizer EQC1 described with reference to FIG. 8 can be executed for each of the signal SG1 and the signal SG2.

For example, when a current of the signal SG1, which is a high-frequency signal, flows through the differential signal transmission path DSn, a part of the signal SG1 is reflected by the high-impedance inductor element PEL, a reflected wave SGR1 (see FIG. 8) is generated, and flows toward the differential signal transmission path DSn.

Also, a portion of the signal SG1 passed through the inductor element PEL is reflected at a resistive element PER2 with a low impedance as compared to the inductor element PEL, resulting in a reflected wave SGR2 (see FIG. 8).

The transition direction of the reflected wave SGR2 is opposite to the transition direction of the waveform of the signal SG1, and is transmitted to the differential signal transmission path DSn later than the reflected wave SGR1.

Therefore, similarly to the equalizer circuit EQC1 described with reference to FIG. 8, the signal input to the input/output circuit IOP2 becomes the signal SGA (see FIG. 9) which is a synthesized wave of the signal SG1 and the reflected wave SGR2, so that the rising edge of the signal waveform of the signal SG1 can be made steep.

Similarly, when a current of the signal SG2, which is a high-frequency signal, flows through the differential signal transmission path DSp, a part of the signal SG2 is reflected by the high-impedance inductor element PEL to generate a reflected wave SGR1 (see FIG. 8) and flows toward the differential signal transmission path DSp.

Also, a portion of the signal SG2 passing through the inductor element PEL is reflected at a resistive element PER1 of low impedance as compared to the inductor element PEL, resulting in a reflected wave SGR2 (see FIG. 8).

The transition direction of the reflected wave SGR2 is opposite to the transition direction of the waveform of the signal SG2, and is transmitted to the differential signal transmission path DSp later than the reflected wave SGR1.

Therefore, the rising edge of the signal waveforms of the signal SG2 can be made steep, similarly to the equalizer EQC1 described with reference to FIG. 8.

The signal SG1 subjected to the signal-waveform correcting process is outputted to the interconnection Tw2n shown in FIG. 15 via the electrode 4PDn2 connected to the differential signal transmission path DSn, the projection electrode 4BP (see FIG. 14), and the terminal 5PDn2 (see FIG. 13).

Similarly, the signal SG2 subjected to the signal-waveform correcting process is outputted to the interconnection Tw2p shown in FIG. 15 via the electrode 4PDp2 connected to the differential signal transmission path DSp, the protruding electrode 4BP, and the terminal 5PDp2 (see FIG. 13).

When a pair of signal transmission paths constituting a differential pair is connected to the same chip component CHP3 as in the present embodiment, it is possible to equalize the effects of electromagnetic waves or the like on the differential pair.

In addition, by connecting a plurality of signal transmission paths to one chip component CHP3, the number of chip components CHP3 can be reduced.

The equalizer circuit EQC shown in FIG. 7 is a passive circuit composed of a plurality of passive elements PE.

The passive circuit does not require driving power for driving the circuit and can correct the signal using the waveform of the input signal.

Therefore, the plurality of electrodes 4PD included in the chip component CHP3 does not include the electrodes (electrode pads) to which the power supply potential VDD or the reference potential VSS shown in FIG. 2 is supplied.

In the embodiment shown in FIG. 7, the plurality of electrodes 4PD included in the chip component CHP3 is composed of four electrodes 4PDn1, 4PDn2, 4PDp1, and 4PDn1.

In this manner, by simplifying the configuration of the equalizer circuits EQCs included in the chip component CHP3, the planar area of the chip component CHP3 can be reduced.

As a result, the mounting densities of the plurality of chip components CHP3 can be improved.

In addition, as the power supply potential and the reference potential are not supplied to the chip component CHP3, the terminals 5PD shown in FIG. 13 do not include the terminals to which the power supply potential VDD or the reference potential VSS shown in FIG. 2 is supplied.

The plurality of terminals 5PD is composed of a plurality of terminals 5PD1 to which signals output from the semiconductor chip CHP1 (see FIG. 6) are input, and terminals 5PD2 to which signals corrected by the equalizer circuits EQC (see FIG. 7) are output.

Since the terminals 5PD for power supply are not included in the plurality of terminals 5PD, the layout of the plurality of terminals 5PD can be simplified.

For example, in the example shown in FIG. 13, the conductor pattern 2CPs for suppressing the spread of the electromagnetic wave is arranged around the terminal 5PD.

Opening portions are formed in the conductive patterns 2CPs, and the terminals 5PDp1 and 5PDn1 constituting the differential pair are disposed in the opening portions so as to be adjacent to each other.

Similarly, the terminal 5PDp2 and the terminal 5PDn2 constituting the differential pair are arranged adjacent to each other in the other opening portion.

In plan view, the conductive patterns 2CPs are arranged between the terminals 5PDp1 and 5PDp2.

Similarly, in plan view, the conductive patterns 2CPs are arranged between the terminals 5PDn1 and 5PDn2.

In other words, the conductive patterns 2CPs are arranged between the terminal 5PD1 for inputting a signal to the chip component CHP3 and the terminal 5PD2 for outputting a signal from the chip component CHP3.

In this instance, it is possible to suppress the spread of the electromagnetic wave from the chip component CHP3 shown in FIG. 14 toward the wiring substrate SUB1.

As shown in FIG. 15, in plan view, each of the wiring Tw1n and the wiring Tw1p extends along the X-direction.

Further, in plan view, the chip component CHP3 is mounted on an extension line in which the wiring Tw1n and the wiring Tw1p extend.

As a result, the layouts of the plurality of chip components CHP3 can be simplified.

Figure 18:
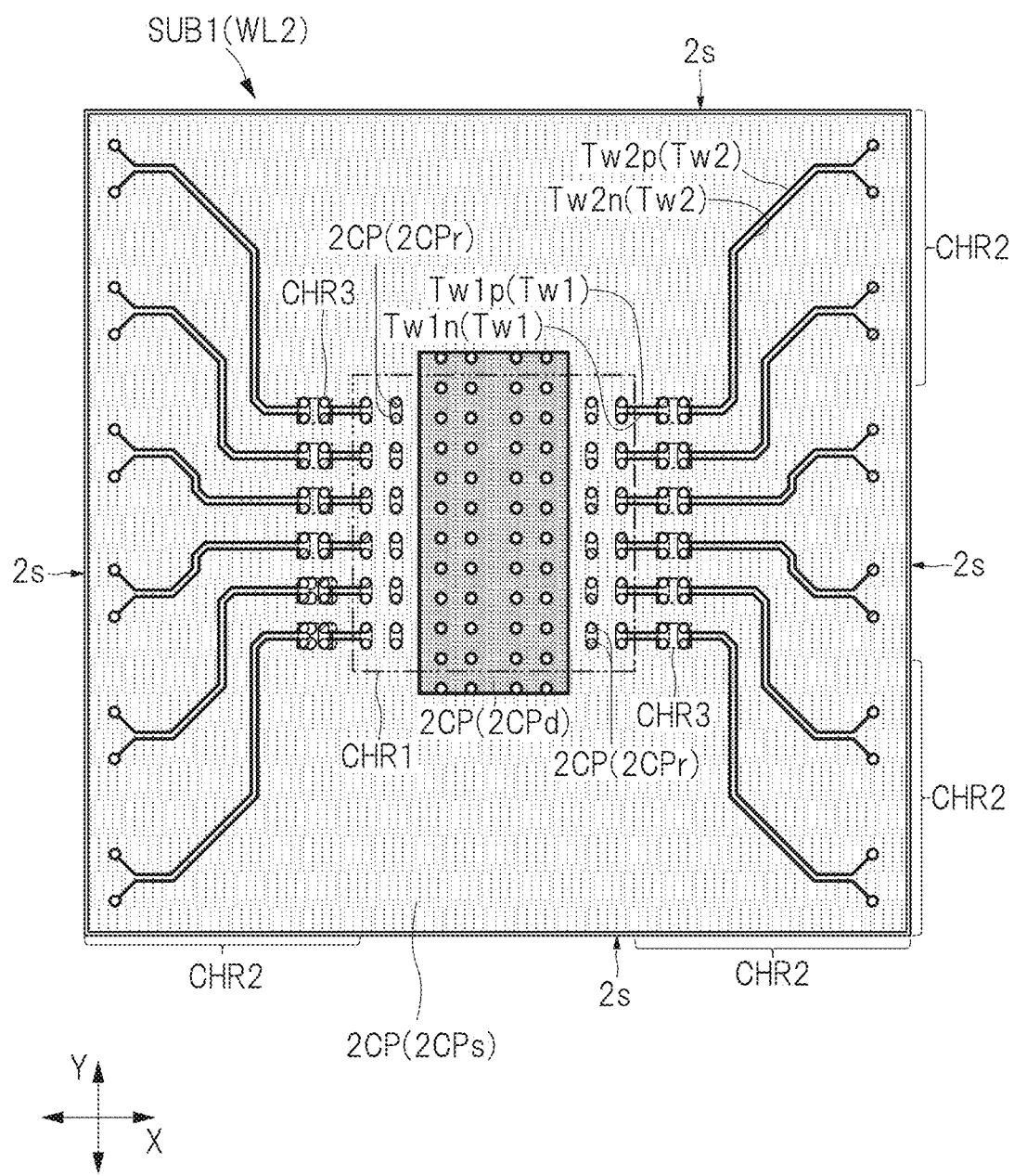
FIG. 18 is plan view of the second wiring layer of the wiring substrate shown in FIG. 12.

In addition, although the plurality of signal transmission paths SGPs is connected to the land 2LD shown in FIG. 5, since it is difficult to connect the plurality of signal transmission paths SGPs to the wiring in the lower layer in the region where the signal transmission paths and the power supplying paths are densely concentrated, the plurality of signal transmission paths SGPs is led out to the peripheral region in the vicinity of the side 2s of the wiring substrate SUB1 via the wiring Tw2 as shown in FIG. 18 described later, and connected to the wiring in the lower layer in the peripheral region.

At this time, when the chip component CHP3 is arranged on the extension line in the directions in which the wiring Tw1n and the wiring Tw1p extend, the extension length of the wiring Tw2 can be shortened.

As shown in FIG. 13, the terminal Ty, the terminal 5PD1, and the terminal 5PD2 are arranged so as to be adjacent to each other in order in the X direction.

Therefore, the signal SGT (see FIG. 1) outputted from the semiconductor chip CHP1 (see FIG. 2) is transmitted along the X-direction in the plan view shown in FIG. 13.

In the present embodiment, as shown in FIG. 2, the semiconductor chip CHP1 has a signal transmission path SGPT through which an output signal from the semiconductor chip CHP1 is transmitted, and a signal transmission path SGPR through which an input signal to the semiconductor chip CHP1 is transmitted.

The chip component CHP3 is connected to the signal transmission path SGPT of the two types of signal transmission paths SGPs, and is not connected to the signal transmission path SGPR.

This is because of the following reasons.

In the semiconductor device PKG1 of the present embodiment, signal corrections are performed by equalizer circuits EQC included in the chip component CHP3 shown in FIG. 7 so that the rising edge of the signal waveforms becomes steep.

Further, by devising the position where the chip component CHP3 is mounted, the signal is corrected by amplifying the amplitudes of the signal waveforms by using the reflections of the signal.

The amplitude of the signal waveform attenuates as the transmission distance increases.

Therefore, the output signal from the semiconductor chip CHP1 has a small attenuation at the time of input to the chip component CHP3, and the output signal has a large amplitude-amplifying effect.

On the other hand, in the vicinity of the semiconductor chip CHP1, the amplitudes of the input signals to the semiconductor chip CHP1 are greatly attenuated.

In other words, the amplitudes of the signals inputted to the semiconductor chip CHP1 are small in the vicinity of the semiconductor chip CHP1.

Therefore, in the case of the gain amplifier circuit of the present embodiment which does not use an amplifier circuit using an active element such as an inverter, the amplification effect on the input signal is lower than the amplification effect on the output signal.

Therefore, in the present embodiment, the chip component CHP3 is connected to the signal transmission path SGPT of the output signal which is relatively effective in amplifying the amplitude.

In the case of the present embodiment, as shown in FIG. 5, the wiring Tw2 for transmitting the output signal and the wiring Rw for transmitting the input signal are formed in mutually different wiring layers.

The wiring Rw is arranged in a lower layer than the wiring Tw2.

In other words, the wiring substrate SUB1 has a wiring Rw through which input signals input to the semiconductor chip CHP1 are transmitted without passing through the chip component CHP3, and a wiring layer WL4 between the wiring layer WL3 and the upper surface 2t and in which the wiring Rw is arranged.

In this manner, by arranging the wiring Rw, which is a part of the signal transmission path that does not pass through the chip component CHP3, in a lower layer than the wiring layer WL2, the wiring layer WL2 can be laid out with a margin.

In addition, even when communication is performed using PAM4 as in the present embodiment, high-frequency signals need to be transmitted in order to improve the data transfer rate.

Therefore, since the wavelength of the signal is short, the path distance LP1 shown in FIG. 10 becomes short.

For example, when the frequency of the signals SG1 and SG2 is 14 GHz and the relative dielectric constant of the dielectric around the signal transmission path is 4, the path distance LP1 is set to about 0.67 mm or more and 2.34 mm or less.

Further, for example, when the frequency of the signals SG1 and SG2 is 25.6 GHz and the relative dielectric constant of the dielectric around the signal transmission path is 4, the path distance LP2 is about 0.36 mm or more and 1.28 mm or less.

Since the path distance LP1 is short as described above, as shown in FIG. 3, the separation distance between the semiconductor chip CHP1 and the chip component CHP3 needs to be short in plan view.

As a result, it is difficult to separately form the underfill resin UF for sealing the electrical connection portion between the semiconductor chip CHP1 and the wiring substrate SUB1 and the underfill resin UF for sealing the electrical connection portion between the chip component CHP3 and the wiring substrate SUB1.

Therefore, as shown in FIG. 3, in plan view, the underfill resin UF is disposed so that the underfill resin UF surrounds a region in which the semiconductor chip CHP1 is disposed and a region in which the plurality of chip components CHP3 is disposed.

In other words, each of the semiconductor chip CHP1 and the plurality of chip components CHP3 is in contact with the underfill resin UF formed integrally with the semiconductor chip CHP3.

Figure 17:
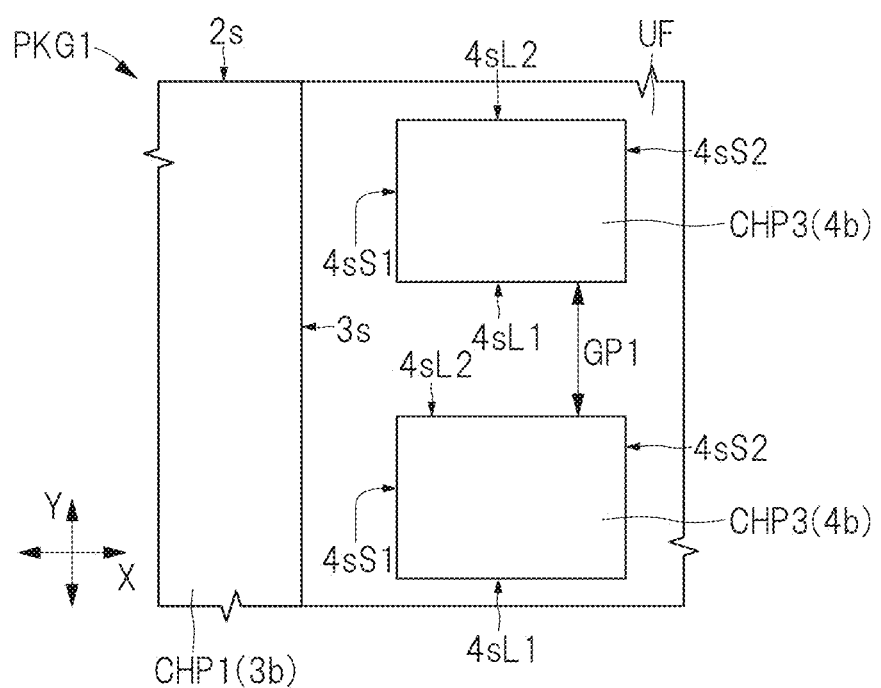
FIG. 17 is an enlarged plan view of part B of FIG. 3.

FIG. 17 is an enlarged plan view of part B of FIG. 3. As shown in FIG. 3, a plurality of chip components CHP3 is mounted on the upper surface $2t$ of the wiring substrate SUB1.

As shown in FIG. 17, each of the plurality of chip components CHP3 has a long side $4sL1$, a long side $4sL2$ on the opposite side of the long side $4sL1$, a short side $4sS1$ intersecting the long side $4sL1$, and a short side $4sS2$ on the opposite side of the short side $4sS1$ in plan view.

Each of the plurality of chip components CHP3 is mounted on the wiring substrate SUB1 (see FIG. 3) so that the short side $4sS1$ faces the semiconductor chip CHP1 (more specifically, the side $3s$ of the semiconductor chip CHP1) in plan view and the long side $4sL1$ and the long side $4sL2$ extend in the X-direction.

As described above, when a plurality of chip components CHP3 is arranged so as to face the semiconductor chip CHP1, focusing on the exclusive area of the chip components CHP3 in the arrangement direction of the chip components (Y direction in the cases of FIGS. 3 and 17), by arranging the short sides $4sS1$ (or the short sides $4sS2$) so as to face the semiconductor chip CHP1 as shown in FIG. 17, the exclusive area can be reduced.

For example, in FIG. 3, the number of chip components CHP3 arranged along the Y-direction is defined by the number of signal transmission paths through which an outgoing signal is transmitted.

If the short sides $4sS1$ of each of the plurality of chip component CHP3 are opposed to the sides $3s$ of the semiconductor chip CHP1, the separation distances GP1 (see FIG. 17) of the adjacent chip component CHP3 can be increased.

Conversely, by shortening the separation distances GP1 between adjacent chip components CHP3, the mounting densities of the chip components arranged along the Y-direction can be increased.

Further, by increasing the separation distance GP1 shown in FIG. 17, the following effects can be obtained.

The manufacturing process of the semiconductor device PKG1 includes a substrate preparation process of preparing the wiring substrate SUB1 shown in FIG. 5.

The manufacturing process of the semiconductor device PKG1 includes a semiconductor chip mounting process in which, after the substrate preparing process, the semiconductor chip CHP1 is mounted on the wiring substrate SUB1 so that the front surface $3t$ of the semiconductor chip CHP1 and the upper surface $2t$ of the wiring substrate SUB1 face each other.

The manufacturing process of the semiconductor device PKG1 includes a chip component mounting process of mounting the chip component CHP3 on the wiring substrate SUB1 so that the front surface $4t$ of the chip component CHP3 and the upper surface $2t$ of the wiring substrate SUB1 face each other after the substrate preparing process.

In the case of the present embodiment, the protruding electrodes 3BP and 4BP shown in FIG. 5 each include a solder material.

In the case of a flip-chip connection method using a conductive member containing a solder material, heat treatment called reflow treatment is performed to melt the solder components contained in the protruding electrodes 3BP and 4BP, thereby connecting the protruding electrodes 3BP and 4BP to the terminals 2PD and 5PD, respectively.

At this time, in order to improve the wettability of the solder, a reflow process is performed with an active material such as flux interposed therebetween.

By using the active material, the bonding reliability of each of the plurality of protruding electrodes 3BP and 4BP can be improved.

However, when an active material is used, a cleaning step of removing a residue of the active material after the reflow treatment may be necessary.

At this time, since the residue of the active materials is discharged to the outside from the space between the semiconductor chip CHP1 and the wiring substrate SUB1, it is preferable to improve the fluidity of the cleaning liquid.

When a plurality of chip components CHP3 is mounted around the semiconductor chip CHP1, the fluidity of the cleaning liquid can be improved by increasing the separation distances GP1 shown in FIG. 17.

That is, according to the present embodiment, the residue of the active materials can be easily discharged to the outside from the space between the semiconductor chip CHP1 and the wiring substrate SUB1.

Next, a layout example of conductor patterns in each wiring layer from the wiring layer WL2 to the wiring layer WL5 shown in FIG. 5 will be described.

FIG. 18 is plan view of the second wiring layer of the wiring substrate shown in FIG. 12.

Figure 19:
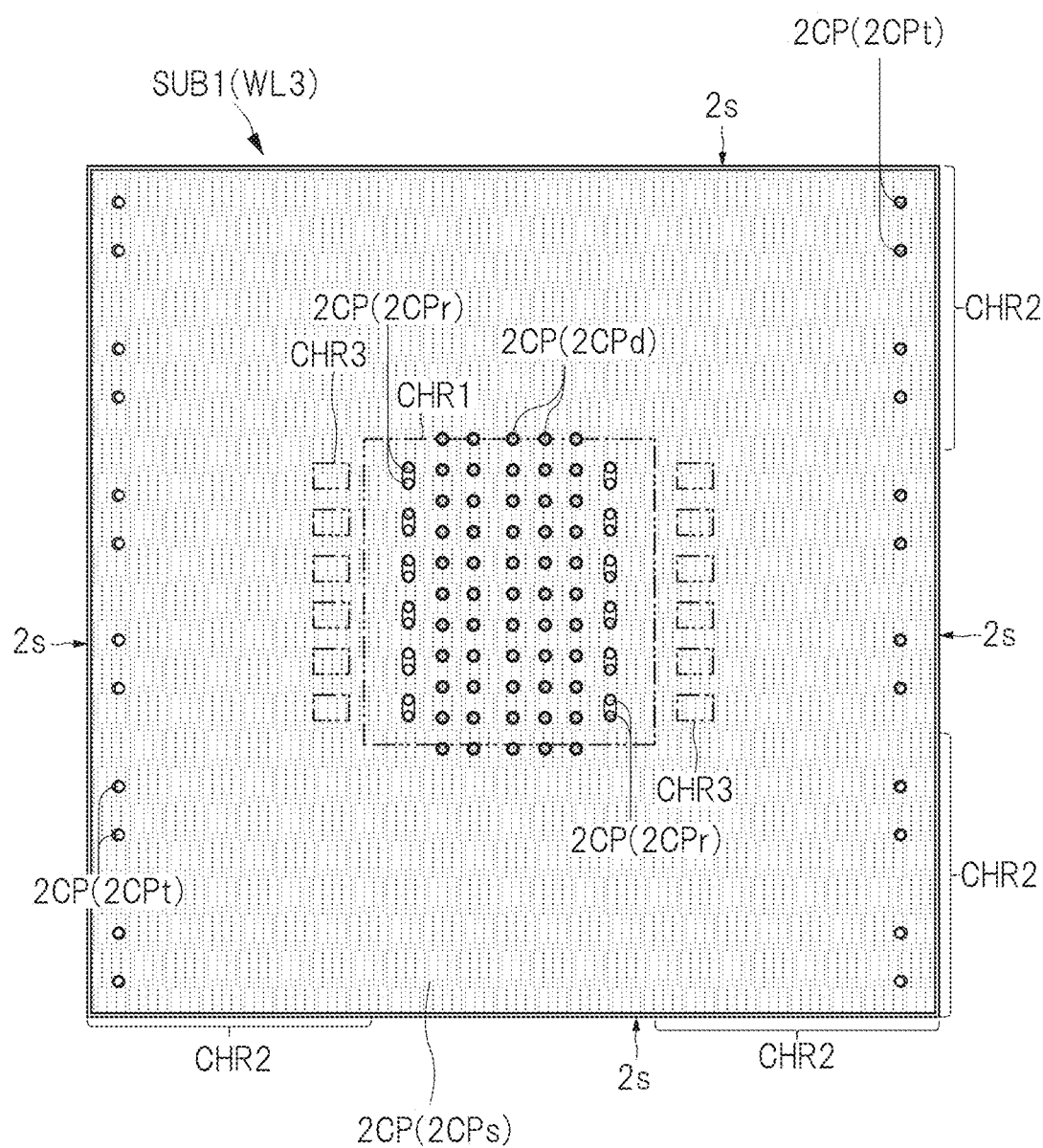
FIG. 19 is plan view of the wiring layer of the third layer of the wiring substrate shown in FIG. 12.

FIG. 19 is plan view of the wiring layer of the third layer of the wiring substrate shown in FIG. 12.

Figure 20:
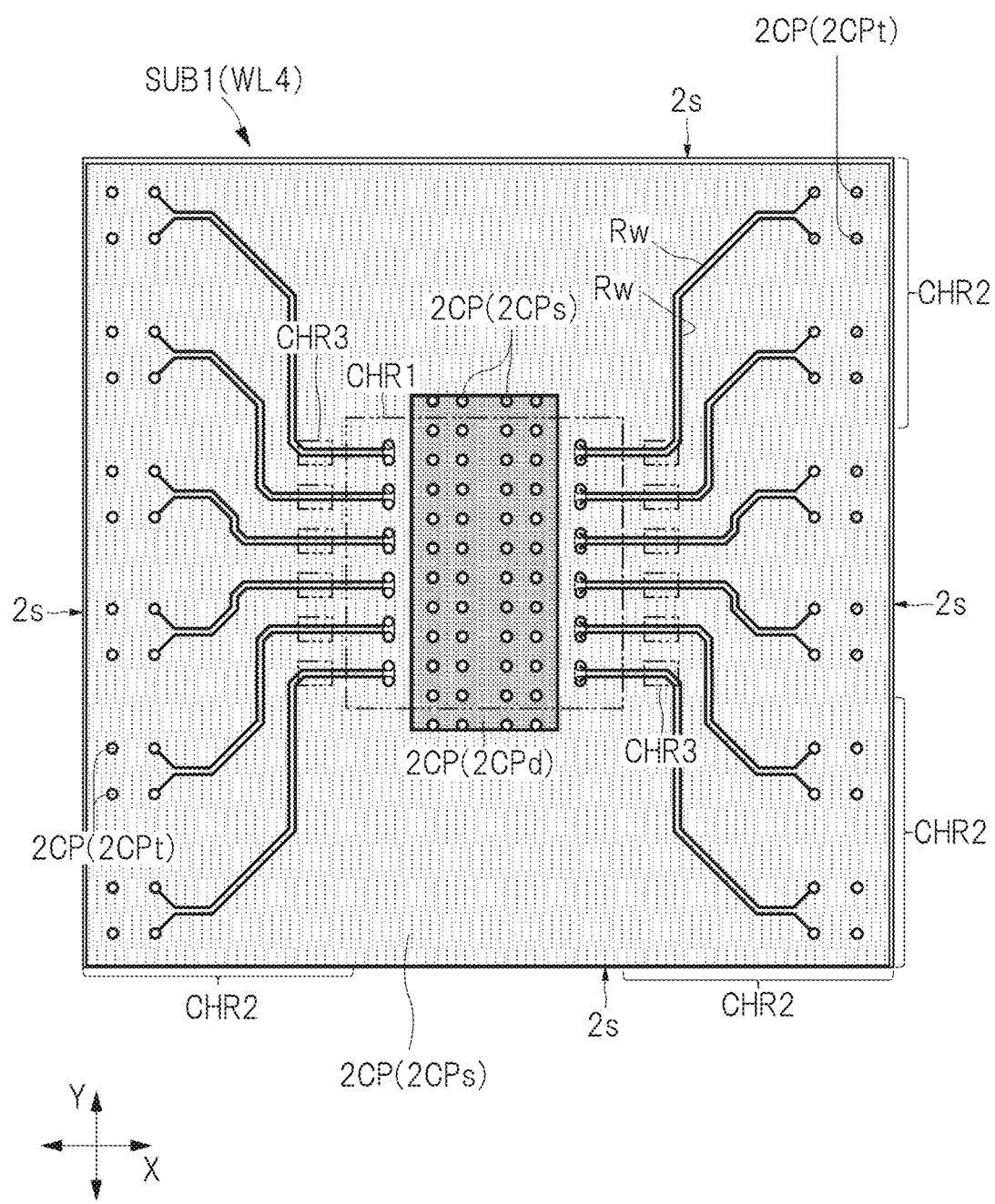
FIG. 20 is plan view of a fourth wiring layer of the wiring substrate shown in FIG. 12.

FIG. 20 is plan view of a fourth wiring layer of the wiring substrate shown in FIG. 12.

Figure 21:
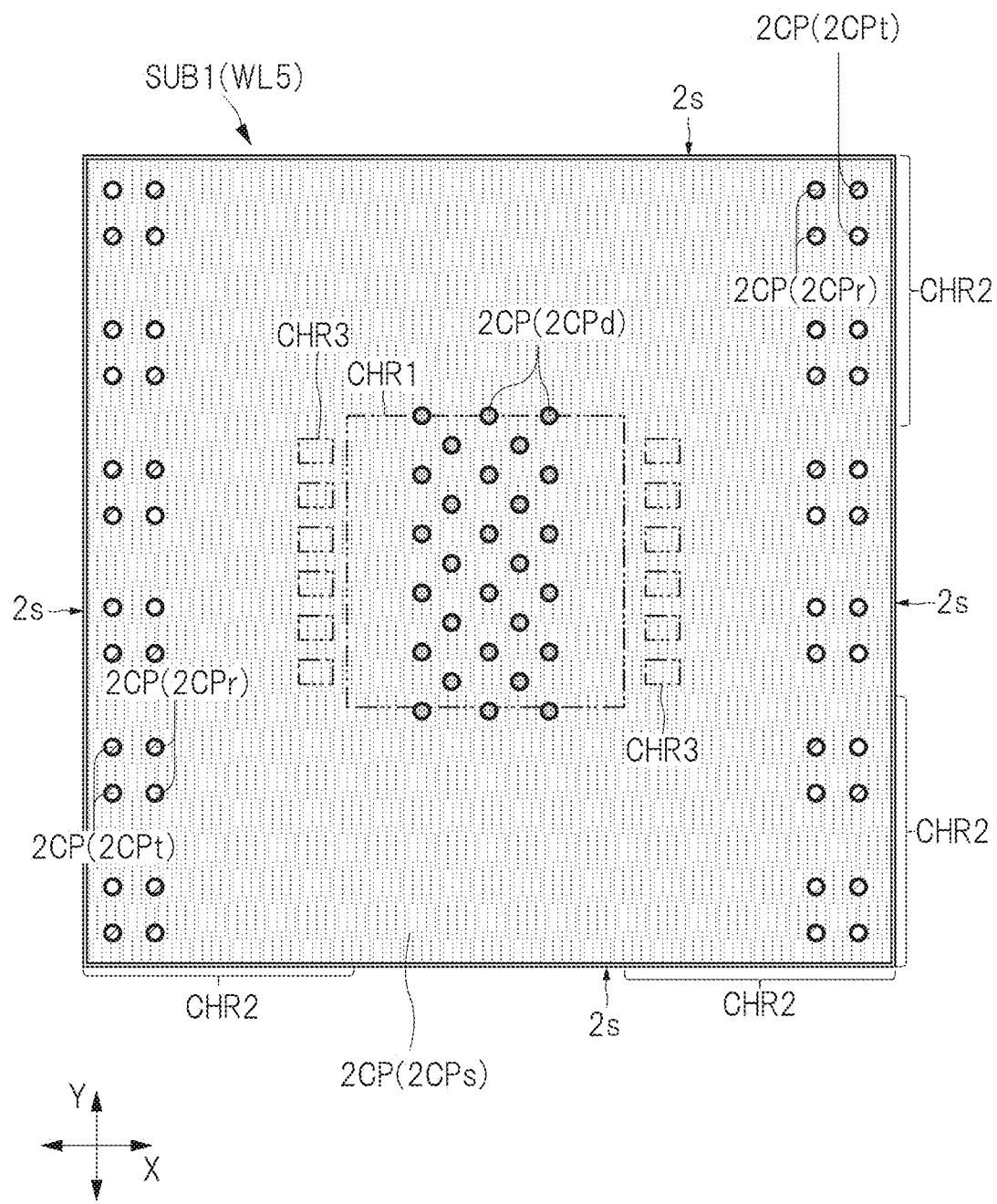
FIG. 21 is plan view of the wiring layer of the fifth layer of the wiring substrate shown in FIG. 12.

FIG. 21 is plan view of the wiring layer of the fifth layer of the wiring substrate shown in FIG. 12.

In FIGS. 18 to 21, hatching or a pattern is attached to each of a plurality of conductor patterns in order to identify the type of signal or potential supplied to each transmission path.

The types of hatching and patterns are indicated by the same rules as those in FIG. 6 and FIG. 7.

In FIGS. 18 and 20, the wirings Tw1 (see FIG. 18), Tw2 (see FIG. 18), and Rw (see FIG. 20) are indicated by thick lines.

Opening portions such as the opening portion 2CPH shown in FIG. 15 are formed in the conductor pattern 2CPs around each of the wirings Tw1, Tw2, and Rw, and each of the wirings Tw1, Tw2, and Rw is arranged in the opening portion.

Therefore, each of the wirings Tw1, Tw2, and Rw is separated from the conductor pattern 2CPs.

In FIGS. 18 and 20, opening portions around the wirings Tw1, Tw2, and Rw are not shown.

As shown in FIG. 16, a plurality of wirings Tw1 and a plurality of wirings Tw2 are arranged in the wiring layer WL2. The wiring Tw1 and the wiring Tw2 are electrically connected to each other.

In the signal transmission path including the wiring Tw1, the via 2vT for electrically connecting the wiring layer WL2 and the wiring layer WL3 shown in FIG. 5 is preferably disposed in the vicinity of the side 2s of the wiring substrate SUB1 in the plan view shown in FIG. 18.

However, as described above, the wiring Tw1 serves as part of the circuit that amplifies the amplitude of the signal, so that the length is defined in accordance with the wavelength of the signal.

In particular, if the signal is a high-frequency signal, the length of the wiring Tw1 needs to be shortened, and it is difficult to draw out the signal transmission path to the vicinity of the side 2s of the wiring substrate SUB1 only with the wiring Tw1.

Therefore, in the case of the present embodiment, the wiring Tw2 is arranged in the wiring layer WL2 in addition to the wiring Tw1.

Since the wiring Tw2 is provided separately from the circuit for amplifying the amplitude of the signal, the path distance is not limited.

Therefore, by interposing the wiring Tw2 in the signal transmission path, the signal transmission path can be freely laid out in the wiring layer WL2.

One end portion of the wiring Tw2 is disposed in the area CHR3 overlapping with the chip component CHP3 (see FIG. 17), and the other end portion of the wiring Tw2 is located closer to one side of the peripheral edge of the wiring substrate SUB1 than the one end portion.

In addition, large-area conductive patterns 2CPd to which power supply potentials are supplied are arranged in the regions CHR1 of the interconnection layers WL2.

The area of the conductor pattern 2CPd in the wiring layer WL2 is larger than the area of each of the plurality of conductor patterns 2CPd in the wiring layer WL1 shown in FIG. 12.

In the vicinity of the semiconductor chip CHP1 (see FIG. 5), a large area conductor pattern 2CPd in which the power potential is supplied can be disposed to stabilize the power supply to the semiconductor chip CHP1.

The conductor pattern 2CPd does not overlap with the signal transmission path of the output signal including the plurality of wirings Tw1 and Tw2.

Similarly, the conductor pattern 2CPd does not overlap the signal transmission path of the output signal including the plurality of wirings Rw.

Therefore, it is possible to reduce the influence of noise on the signal transmission path caused by the supply of the power supply potential to the conductor pattern 2CPd.

Around the conductor pattern 2CPd of the wiring layer WL2, a large-area conductor pattern 2CPs to which a reference potential is supplied is arranged.

The conductor pattern 2CPs is arranged around the plurality of wirings Tw1 and the plurality of wirings Tw2 so as to be separated from the plurality of wirings Tw1 and the plurality of wirings Tw2.

Electromagnetic waves generated from the wirings Tw1 and Tw2 are shielded by the conductor patterns 2CPs.

In addition, a plurality of conductor patterns 2CPr, which constitutes a part of a signal transmission path through which an input signal to the semiconductor chip CHP1 is transmitted, are arranged in the area CHR1 of the interconnection layer WL2.

Each of the plurality of conductor patterns 2CPr is disposed in an opening portion 2CPH of the conductor pattern 2CPs (see FIG. 15) spaced apart from the conductor pattern 2CPs.

As shown in FIG. 19, conductor patterns 2CPs are formed in the wiring layer WL3.

Most of the wiring layer WL3 is covered with the conductor pattern 2CPs.

The conductor pattern 2CPs is electrically connected to the conductor pattern 2CPs of the wiring layer WL2 illustrated in FIG. 18 via vias 2vs. (see FIG. 14).

A plurality of conductive patterns 2CPt constituting a part of a signal transmission path through which an output signal is transmitted is arranged in the area CHR2 of the interconnection layer WL3.

Each of the plurality of conductor patterns 2CPt is disposed in an opening portion of the conductor pattern 2CPs so as to be separated from the conductor pattern 2CPs.

Each of the plurality of conductor patterns 2CPt is electrically connected to the wiring Tw2 of the wiring layer WL2 shown in FIG. 18 via 2vT (see FIG. 5).

The end portion of the wiring Tw2 shown in FIG. 18 and the conductor pattern 2CPt shown in FIG. 19 overlap each other in plan view.

In the area CHR1 of the wiring layer WL3, a plurality of conductor patterns 2CPr that forms part of the signal transmission path in which the input signal is transmitted to the semiconductor chip CHP1 (see FIG. 5) is disposed.

Each of the plurality of conductor patterns 2CPr is disposed in an opening portion 2CPH of the conductor pattern 2CPs (see FIG. 15) spaced apart from the conductor pattern 2CPs.

Each of the plurality of conductor patterns 2CPr is electrically connected to the conductor pattern 2CPr of the wiring layer WL2 shown in FIG. 18 through the via 2vR shown in FIG. 14.

The conductor pattern 2CPr shown in FIG. 18 and the conductor pattern 2CPr shown in FIG. 19 overlap each other in plan view.

A plurality of conductive patterns 2CPd is arranged in the area CHR1 of the interconnection layer WL3.

Each of the plurality of conductor patterns 2CPd is electrically connected to the conductor pattern 2CPd of the wiring layer WL2 shown in FIG. 19 via a via 2v.

Each of the plurality of conductor patterns 2CPd is separated from the conductor pattern 2CPs.

As shown in FIG. 20, a plurality of wirings Rw is arranged in the wiring layer WL4.

In the signal transmission path including the wiring line Rw, it is preferable that the via 2v electrically connecting the wiring layer WL4 and the wiring layer WL3 shown in FIG. 5 is disposed in the vicinity of the side 2s of the wiring substrate SUB1 in the plan view shown in FIG. 20.

Therefore, each of the plurality of wirings Rw extends so as to straddle the region CHR1 and the region CHR2 in plan view. One end portion of the wiring Rw is disposed in the area CHR1, and the other end portion of the wiring Rw is located closer to one side of the peripheral edge of the wiring substrate SUB1 than the one end portion.

One end of the wire Rw is electrically connected to the conductive pattern 2CPr shown in FIG. 19 through the via 2vR shown in FIG. 14 in the area CHR1.

In the example of this embodiment, the wiring Rw overlaps with the wiring Tw1 and the wiring Tw2 of the wiring layer WL2 shown in FIG. 18.

As shown in FIG. 14, the conductor pattern 2CPs is interposed between the wiring Rw and the wiring Tw1 and between the wiring Rw and the wiring Tw2.

Therefore, even when the wiring Rw is arranged in a state overlapping with the wiring Tw1 and the wiring Tw2, the crosstalk noise between the signal transmission paths can be reduced.

In addition, large-area conductive patterns 2CPd to which power supply potentials are supplied are arranged on the area CHR1 of the interconnection layers WL4.

The area of the conductor pattern 2CPd in the wiring layer WL4 is larger than the area of each of the plurality of conductor patterns 2CPd in the wiring layer WL1 shown in FIG. 12.

The conductor pattern 2CPd is electrically connected to each of the plurality of conductor patterns 2CPd of the wiring layer WL3 showns in FIG. 19 via vias 2v (see FIG. 5).

Around the conductor pattern 2CPd of the wiring layer WL4, a large-area conductor pattern 2CPs to which a reference potential is supplied is arranged.

The conductor pattern 2CPs is electrically connected to the conductor pattern 2CPs of the wiring layer WL3 illustrated in FIG. 19 via vias 2vs. (see FIG. 14).

The conductor pattern 2CPs is arranged around the plurality of wirings Rw so as to be separated from the plurality of wirings Rw.

The electromagnetic wave generated from the wiring Rw is shielded by the conductor pattern 2CPs.

A plurality of conductor patterns 2CPs is arranged inside the conductor pattern 2CPd of the wiring layer WL4.

Each of the plurality of conductor patterns 2CPs is electrically connected to the conductor pattern 2CPs of the wiring layer WL3 shown in FIG. 19 via the via 2vs.

As shown in FIG. 21, conductor patterns 2CPs are formed in the wiring layer WL5.

Most of the wiring layer WL5 is covered with the conductor pattern 2CPs.

The conductor pattern 2CPs is electrically connected to the conductor pattern 2CPs of the wiring layer WL4 illustrated in FIG. 20 via vias 2vs. (see FIG. 14).

A plurality of conductive patterns 2CPt constituting a part of a signal transmission path through which an output signal is transmitted are arranged in the area CHR2 of the interconnection layer WL5.

Each of the plurality of conductor patterns 2CPt is disposed in an opening portion of the conductor pattern 2CPs so as to be separated from the conductor pattern 2CPs.

Each of the plurality of conductor patterns 2CPt is electrically connected to the wiring Tw2 of the wiring layer WL2 shown in FIG. 18 via 2vT (see FIG. 5).

The end of the wiring Tw2 shown in FIG. 18 and the conductor pattern 2CPt shown in FIG. 21 overlap each other in plan view.

In addition, a plurality of conductor patterns 2CPr, which constitutes a part of a signal transmission path through which an input signal to the semiconductor chip CHP1 is transmitted, are arranged in the area CHR2 of the interconnection layer WL5, and the plurality of conductor patterns 2CPr constitutes a part of a signal transmission path through which an input signal to the semiconductor chip CHR2 is transmitted.

Each of the plurality of conductor patterns 2CPr is disposed in an opening portion of the conductor pattern 2CPs so as to be separated from the conductor pattern 2CPs.

Each of the plurality of conductor patterns 2CPr is electrically connected to the wiring Rw of the wiring layer WL4 shown in FIG. 20 via a via 2vR.

The end portion of the wiring Rw shown in FIG. 20 and the conductor pattern 2CPr shown in FIG. 21 overlap each other in plan view.

In addition, a plurality of conductive patterns 2CPd is arranged in the area CHR1 of the interconnection layer WL5.

Each of the plurality of conductor patterns 2CPd is electrically connected to the conductor pattern 2CPd of the wiring layer WL4 shown in FIG. 21 via a via 2v.

Each of the plurality of conductor patterns 2CPd is separated from the conductor pattern 2CPs.

The area CHR1 of the wiring layer WL5 includes the conductor pattern 2CPs and the plurality of conductor patterns 2CPd, but the conductor pattern 2CP that constitutes the signal transmission path is not disposed.

Therefore, in each of the wiring layers lower than the wiring layer WL5, i.e., the wiring layers WL6 to WL10 shown in FIG. 5, in the area CHR1, a large-area conductor pattern 2CP can be arranged as a supply path of the power supply potential or a supply path of the reference potential.

As shown in FIG. 5, each of the plurality of conductor patterns 2CP arranged in the wiring layer WL5 is electrically connected to the wiring layer WL6 via the through-hole wiring 2THW.

Hereinafter, the wiring layers of the wiring layers WL6 to WL9 are the same as those of the wiring layer WL5, but the conductive patterns 2CPd having a large area are sometimes arranged in the area CHR1, so that illustration thereof is omitted.

Next, a method of manufacturing the above-described semiconductor device will be described.

Figure 22:
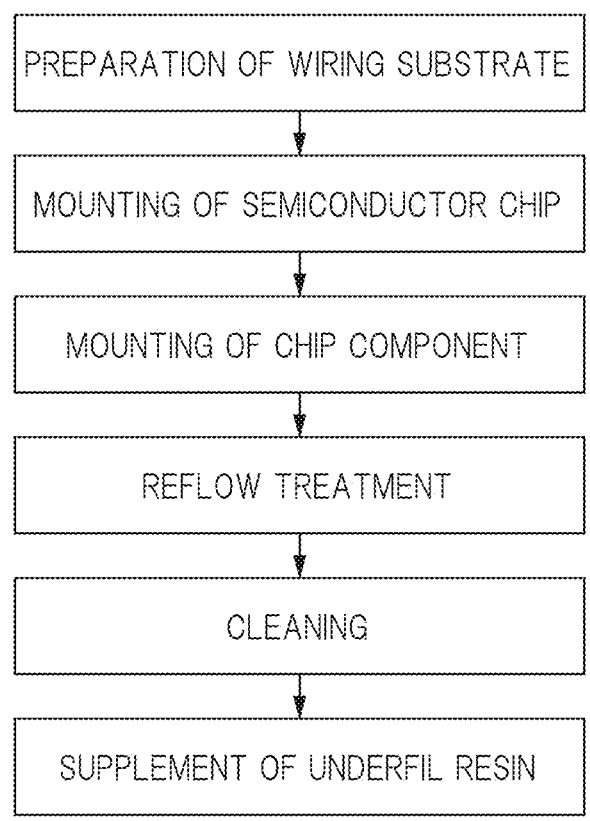
FIG. 22 is an explanatory view showing an example of a manufacturing flow of the semiconductor device shown in FIG. 5.

FIG. 22 is an explanatory view showing an example of a manufacturing flow of the semiconductor device shown in FIG. 5.

Figure 23:
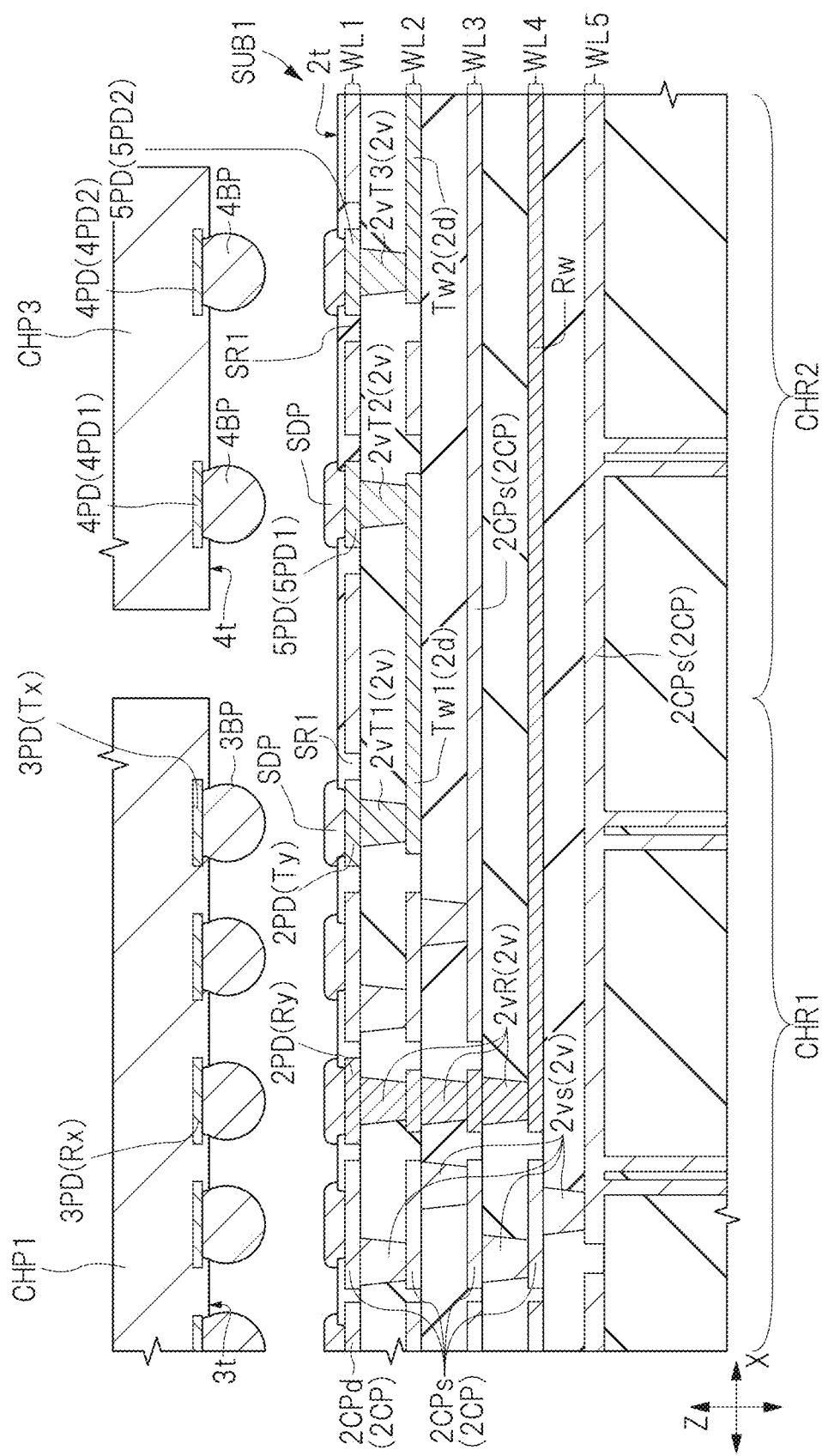
FIG. 23 is an enlarged cross-sectional view for explaining the semiconductor chip mounting process and the chip component mounting process shown in FIG. 5.

FIG. 23 is an enlarged cross-sectional view for explaining the semiconductor chip mounting process and the chip component mounting process shown in FIG. 5.

Figure 24:
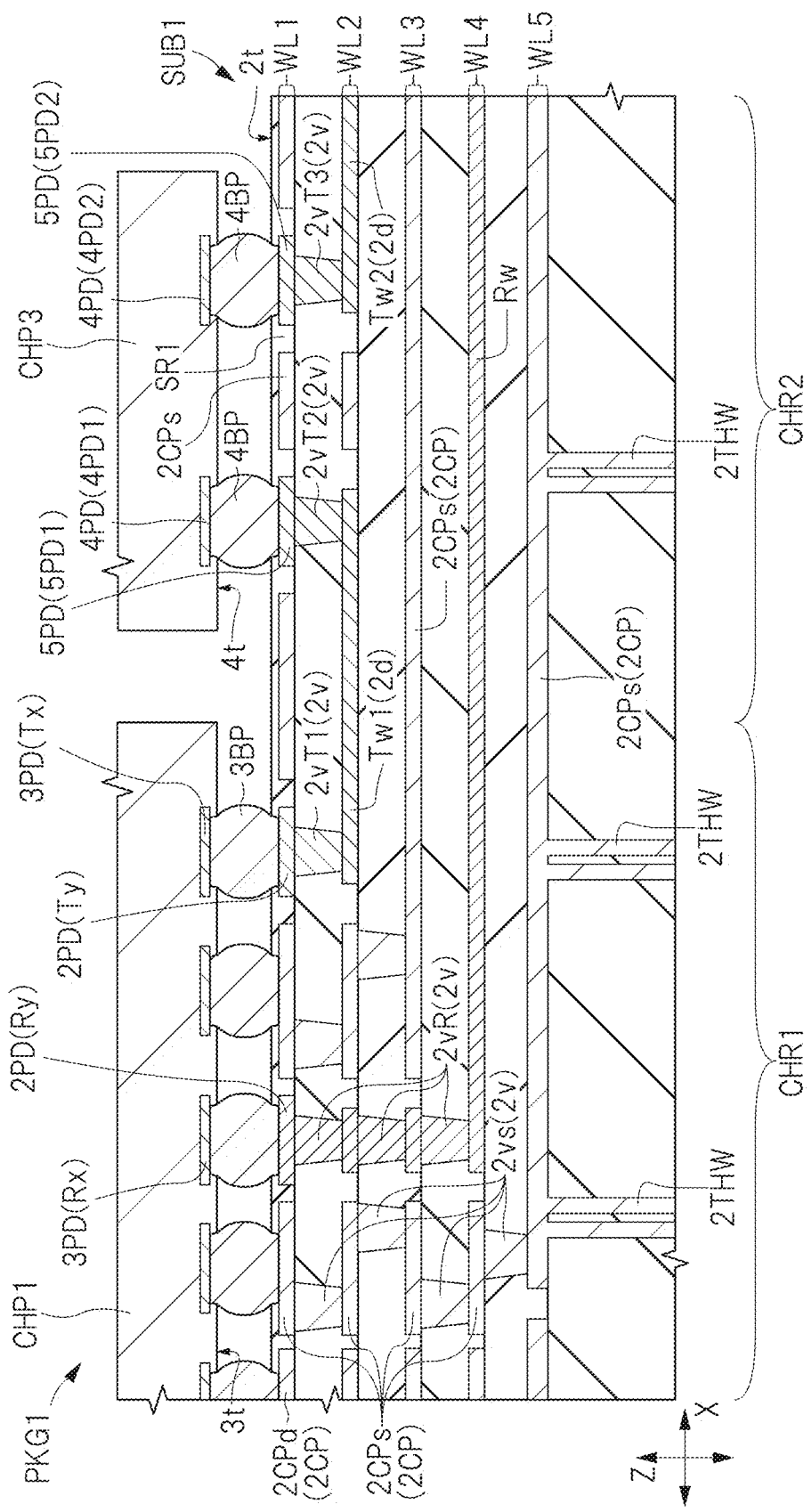
FIG. 24 is an enlarged cross-sectional view illustrating the reflow process shown in FIG. 5.
Figure 25:
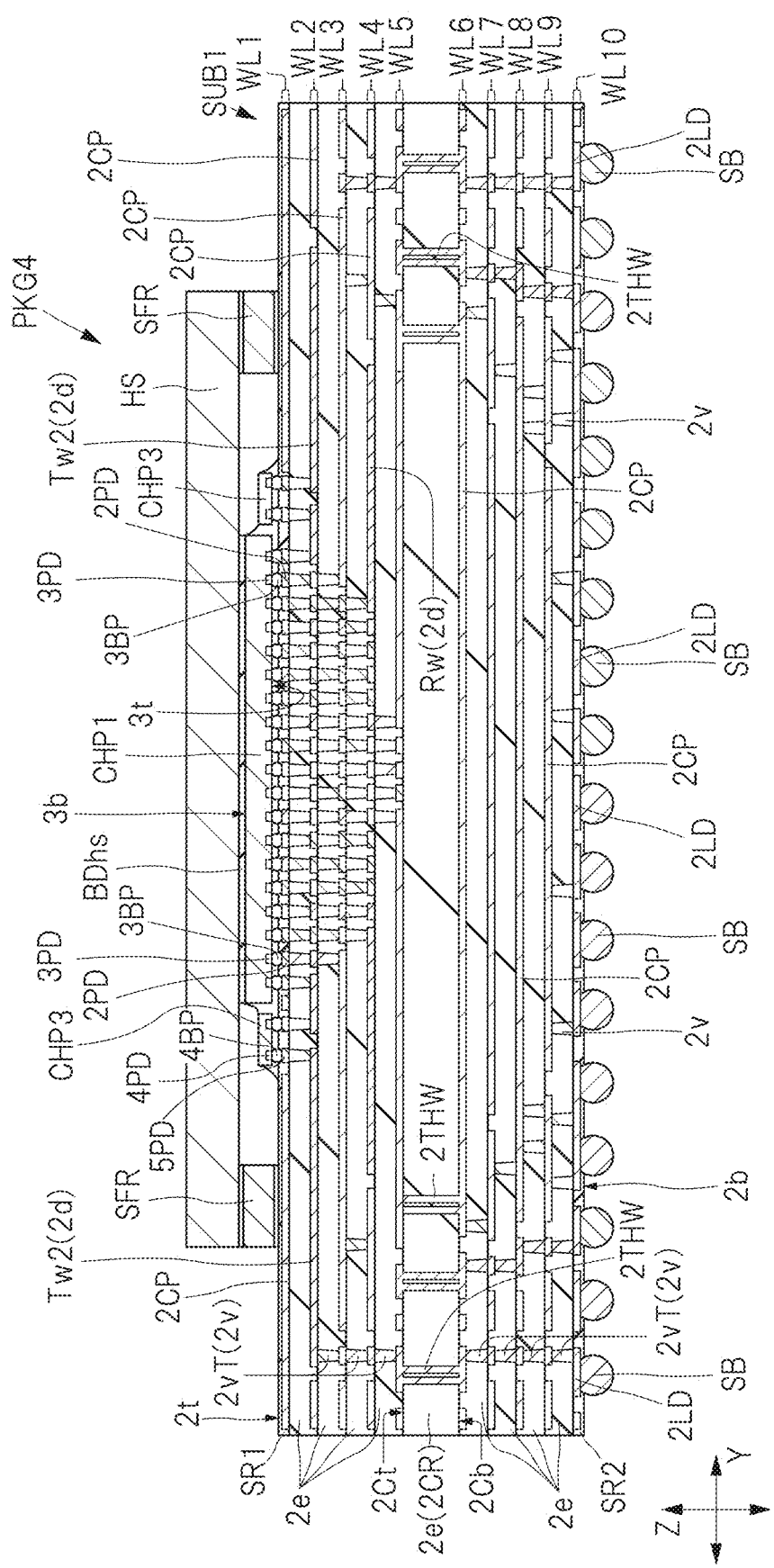
FIG. 25 is a cross-sectional view of a semiconductor device as a modification to FIG. 5.

FIG. 24 is an enlarged cross-sectional view illustrating the reflow process shown in FIG. 5.

As shown in FIG. 22, the manufacturing process of the semiconductor device PKG1 shown in FIG. 5 includes a substrate preparation process for preparing the wiring substrate SUB1 shown in FIG. 5.

The manufacturing process of the semiconductor device PKG1 includes a semiconductor chip mounting process in which, after the substrate preparing process, the semiconductor chip CHP1 is mounted on the wiring substrate SUB1 so that the front surface 3t of the semiconductor chip CHP1 and the upper surface 2t of the wiring substrate SUB1 face each other.

The manufacturing process of the semiconductor device PKG1 includes a chip component mounting process of mounting the chip component CHP3 on the wiring substrate SUB1 so that the front surface 4t of the chip component CHP3 and the upper surface 2t of the wiring substrate SUB1 face each other after the substrate preparing process.

Either of the semiconductor chip mounting step and the chip component mounting step may be performed first.

However, it is preferable that the reflow process (see FIG. 9) in which the electrode 3PD and the terminal 2PD are electrically connected by melting at least a part of the protruding electrode 3BP shown in FIG. 14 and the electrode 4PD and the terminal 5PD are electrically connected by melting at least a part of the protruding electrode 4BP is performed collectively as shown in FIG. 22.

What is claimed is:

1. A semiconductor device comprising:
    a wiring substrate having a first main surface, a second main surface opposite the first main surface and a plurality of wiring layers;
    a first semiconductor chip having a first front surface, a first rear surface opposite the first front surface and mounted on the wiring substrate such that the first front surface faces the first main surface of the wiring substrate; and
    a first chip component having a second front surface and a second rear surface opposite the second front surface,
    wherein the first semiconductor chip includes a first circuit and a first electrode pad formed on the first front surface,
    wherein the first electrode pad for a first signal is electrically connected with the first circuit,
    wherein the first chip component includes a plurality of kinds of passive elements, a second circuit correcting a waveform of the first signal, and a second electrode pad formed on the second front surface of the first chip component
    wherein the second electrode pad is electrically connected with the second circuit and the first electrode pad of the first semiconductor chip,
    wherein the wiring substrate includes a first terminal electrically connected with the first electrode pad of the first semiconductor chip via a first conductive member, and a first wire electrically connected with the first terminal and the second electrode pad of the first chip component, and
    wherein a path distance from the first electrode pad of the first semiconductor chip to the second electrode pad of the chip component is in a range of 1/16 of a wavelength of the first signal to 3.5/16 of the wavelength thereof.

2. The semiconductor device according to claim 1,
    wherein the first electrode pad of the first semiconductor chip faces the first terminal of the wiring substrate,
    wherein the chip component is disposed on the semiconductor chip such that the second front surface of the chip component faces the first main surface of the wiring substrate,
    wherein the wiring substrate includes a second terminal electrically connected with the second electrode pad of the first chip component via a second conductive member such that the second terminal faces the second electrode pad of the first chip component, and wherein the first wiring of the wiring substrate connects the first terminal of the wiring substrate with the second terminal of the wiring substrate.

3. The semiconductor device according to claim 2,
    wherein an underfill is disposed between the first semiconductor chip and the wiring substrate and between the first chip component and the wiring substrate respectively, and
    wherein the underfill is disposed between the first semiconductor chip and the wiring substrate, and between the first chip component and the wiring substrate respectively, and
    wherein, in plan view, a region on which the semiconductor is mounted and a region on which the first chip component is mounted are surrounded with the underfill.

4. The semiconductor device according to claim 2,
    wherein the first wiring extends in a first direction,
    wherein a plurality of chip components includes the first chip component are mounted on the first main surface of the wiring substrate,
    wherein, in plan view, each of the plurality of chip components includes a first long side and a first short side intersecting the first long side, and
    wherein, in plan view, the plurality of chip components is mounted on the wiring substrate such that the first short side faces the first semiconductor chip and such that the first long side extends along the first direction.

5. The semiconductor device according to claim 4,
    wherein each of the first and second conductive members includes solder.

6. The semiconductor device according to claim 2,
    wherein the wiring substrate includes a first wiring layer on which the first and second terminals are disposed, and a second wiring layer disposed between the first wiring layer and the second main surface of the wiring substrate,
    wherein the first wiring is disposed in the second wiring layer, and
    wherein the first wiring is electrically connected with the first terminal via a first via and is electrically connected with the second terminals via a second via.

7. The semiconductor device according to claim 6,
    wherein the wiring substrate includes a third wiring layer disposed between the second wiring layer and the second main surface,
    wherein the first and the third wiring layer are adjacent to the second wiring layer in a thickness direction of the wiring substrate,
    wherein the first conductive pattern supplied with a reference potential is disposed in each of the first and third wiring layers, and
    wherein the first wiring is sandwiched between the first conductive pattern of the first wiring layer and the first conductive pattern of the third wiring layer in the thickness direction.

8. The semiconductor device according to claim 7,
    wherein the first conductive pattern supplied with the reference potential is disposed in the second wiring substrate,
    wherein a first opening portion is formed in the first conductive pattern, and
    wherein, in plan view, the first wiring is disposed in the first opening portion such that the first wiring is separated from the first conductive pattern.

9. The semiconductor device according to claim 7,
wherein the first signal is a transmission signal which is outputted from the first electrode pad, and
wherein the wiring substrate includes a third wiring transmitting an input signal to the first semiconductor chip not via the first component, and a fourth layer which is disposed between the third wiring layer and the second main surface and in which the third wiring is disposed.

10. The semiconductor device according to claim 6,
wherein the first via is connected to a first terminal portion of the first wiring,
wherein the second via is connected to a second terminal portion of the first wiring, and
wherein the path distance from the first and second terminal portions is in a range of 1/16 of a wavelength of the first signal to 3.5/16 of the wavelength thereof.

11. The semiconductor device according to claim 1,
wherein a plurality of transmission signals is transmitted from the first semiconductor chip and include the first signal and a second signal of which a differential signal pair is comprised,
wherein each of the first and second signals is inputted in the first chip component, and
wherein the second circuit of the first chip component corrects the waveform of the first signal and a waveform of the second signal.

12. The semiconductor device according to claim 1,
wherein a plurality of transmission signals is transmitted from the first semiconductor chip and include the first signal and a second signal of which a differential signal pair is comprised,
wherein the first semiconductor chip includes a third electrode pad which is disposed on the first front surface and which transmits the second signal,
wherein the first chip component includes the second circuit which is electrically connected with the first and second electrode pads and which corrects each of waveforms of the first and second signals, and a fourth electrode pad which is disposed on the second front surface and which is electrically connected with the third electrode pad and the second circuit,
wherein the wiring substrate includes a third terminal electrically connected with the third electrode pad of the semiconductor chip via a third conductive member, a fourth terminal electrically connected with a fourth electrode pad of the semiconductor chip via a fourth conductive member, and a second wiring electrically connected with the third and fourth terminals, and
wherein a path distance from the third electrode pad of the first semiconductor chip to the fourth electrode pad of the chip component is in a range of 1/16 of a wavelength of the first signal to 3.5/16 of the wavelength thereof.

13. The semiconductor device according to claim 12,
wherein a plurality of electrode pads of the first component consists of the second electrode pad, a fifth electrode pad which is electrically connected with the second electrode pad and which transmits a correcting waveform of the first signal, the fourth electrode pad, and a sixth electrode pad which is electrically connected with the fourth electrode pad and which transmits a correcting waveform of the second signal, and
wherein the plurality of electrode pads of the first component does not include an electrode pad which supplies a power potential to the first chip component and an electrode pad which supplies the reference potential to the first chip component.

14. The semiconductor device according to claim 13,
wherein the wiring substrate includes the second terminal facing the second electrode pad of the first chip component, the fourth terminal facing the fourth electrode pad of the first chip component, a fifth terminal facing the fifth electrode pad of the first chip component, a sixth terminal facing the sixth electrode pad of the first chip component, and a first wiring layer on which the first, second, third, fourth, fifth, and sixth terminals are disposed, and
wherein, in the first layer, a conductive pattern supplied with the reference potential is interposed between the second and fifth terminals, and between the fourth and sixth terminals.

15. The semiconductor device according to claim 14,
wherein the second circuit of the first chip component includes a resistive element and an inductor element.

16. The semiconductor device according to claim 12,
wherein the wiring substrate includes a first wiring layer on which the first and second terminals are disposed, and a second wiring layer which is disposed between the first wiring layer and the second main surface and in which the first and second wirings and a first conductive pattern supplied with a reference potential are disposed,
wherein a first opening portion is formed in the first conductive pattern of the second wiring layer, and
wherein, in plan view, the first and second wirings separate from the first conductive pattern and are arranged adjacent to each other in the first opening portion.

17. The semiconductor device according to claim 16,
wherein, in plan view, the first and second wirings extend along a first direction, and
wherein in plan view, the first chip component is mounted on an extension line extending in a direction along the first and second wirings.

18. The semiconductor device according to claim 16,
wherein the second circuit of the first chip component comprises of a plurality of kinds of passive components and does not include an active component.

19. The semiconductor device according to claim 1,
wherein the first signal is an output signal which is outputted from the fist electrode pad.

* * * * *